United States Patent
Aronov

(10) Patent No.: US 7,184,597 B1
(45) Date of Patent: Feb. 27, 2007

(54) METHOD OF COMPRESSION OF BINARY DATA WITH A RANDOM NUMBER GENERATOR

(76) Inventor: Edward Lasar Aronov, 2528 Cruger Ave. Apt, 4C, Bronx, NY (US) 10467

( * ) Notice: Subject to any disclaimer, the term of this patent is extended or adjusted under 35 U.S.C. 154(b) by 574 days.

(21) Appl. No.: 10/744,758

(22) Filed: Dec. 23, 2003

Related U.S. Application Data

(63) Continuation-in-part of application No. 10/243,196, filed on Sep. 13, 2002, now Pat. No. 6,674,908.

(60) Provisional application No. 60/377,683, filed on May 4, 2002.

(51) Int. Cl.
*G06K 9/36* (2006.01)
(52) U.S. Cl. .................... 382/232; 382/244; 382/248
(58) Field of Classification Search ............ 382/232, 382/239, 244, 245, 246, 247, 248, 249; 341/51, 341/52, 61, 62
See application file for complete search history.

(56) References Cited

U.S. PATENT DOCUMENTS

| | | | |
|---|---|---|---|
| 5,406,279 A | 4/1995 | Anderson | 341/51 |
| 5,533,051 A | 7/1996 | James | 375/240 |
| 5,612,693 A | 3/1997 | Craft | |
| 5,877,711 A | 3/1999 | Craft | |
| 5,977,889 A | 11/1999 | Cohen | 341/55 |
| 6,075,470 A | 6/2000 | Little | 341/107 |
| 6,088,699 A | 7/2000 | Gampper | 707/10 |
| 6,122,379 A | 9/2000 | Barbur | 380/269 |
| 6,141,445 A | 10/2000 | Castelli | 382/232 |
| 6,172,624 B1 | 1/2001 | Cooper | 341/63 |
| 6,191,710 B1 | 2/2001 | Waletzki | |
| 6,333,705 B1 | 12/2001 | Amonou | 341/107 |
| 6,351,539 B1 | 2/2002 | Djakovic | 380/268 |
| 6,411,228 B1 | 6/2002 | Malik | |
| 6,411,714 B1 | 6/2002 | Yoshiura | 380/269 |
| 6,501,398 B2 | 12/2002 | Toyokura | |
| 6,518,895 B1 | 2/2003 | Weiss | |
| 6,535,642 B1 | 3/2003 | De Bonet | |
| 6,552,673 B2 | 4/2003 | Webb | |
| 6,618,831 B2 | 9/2003 | Lippencott | |
| 2003/0117299 A1 | 6/2003 | Jones | |

OTHER PUBLICATIONS

R.N.Willams. An Extremly Fast Ziv-Lempel Data Compression Algorithm. Data Compression Conference, Utah, DCC-1991,IEEE,Los Alamitos,CA. pp. 363-371.

(Continued)

*Primary Examiner*—Duy M. Dang

(57) ABSTRACT

A dictionary based accelerated method of lossless compression and encryption of data with a small statistical redundancy. The sequence of the least distances obtained between every input numerical sample and the samples of the several dictionaries, produced by random number generators, and statistical compression is further applied. The process is accelerated utilizing a packed content addressable memory (CAM) for dictionary and input samples. CAM is scanned for a marking bit indicating a presence of a dictionary sample to find the least distance. CAM is packed and loaded with successful ranges of the amplitudes of both dictionary and input samples to reduce an address space and to accelerate the process of compression further. The least distances are founded for an unique alphabet of the input sequence, and the results are merged with an original input to accelerate the process of compression further.

20 Claims, 19 Drawing Sheets

OTHER PUBLICATIONS

P.A.Franaszek. Algorithms and Data Structures for Compressed-Memory Machines, IBM J.Res. & Dev. v.45, n.2, Mar. 2001, pp. 245-257.

D.Salomon. Data Compression: the complete reference. NY: Springer, 2000.

D.Modha. Codelet Parsing:Quadratic-time,Sequential,Adaptive Algorithms for Lossy Compression.Data Compression Conference,Utah,DCC-2003,IEEE, Los Alamitos,CA. pp. 223-231.

Salomon D. Data Compression. The Complete Reference, Second Edition, Springer, 2000 pp. 62-64, 67, 126, 151-157, 35-37.

Sedgewick R. Algorithms. Addison-Wesley Publishing Company, 1988, pp. 93-98, 333-342, 509-514.

Niederreiter H. Random Number Generation and Quasi—Monte Carlo Methods. Soc. for Ind. and App. Math, Phil. 1992, pp. 165-171, 175, 177, 191-204.

Raok., Yip P. The Transform and Data Compression Handbook CRC Press, 2000, pp. 13-15, 35-37, 61-63 73-75 117-123, 161-167, 191.

Celko J. SQL for Smarties. Morgan Kaufman Publ. S F, 1995, pp. 2-3, 10-11.

Storer J. Data Compression: Methods and Theory Computer Science Press, Rockville, MD, 1988. pp. 6, 7, 10, 11, 103-111, 114-115, 126-128.

| 700 | 702 | 704 |
|---|---|---|
| CONSEQUENT BINS NUMBER: BINS_I | DIST1 - DISTN | IND D1 - IND DN |

| 706 | 708 | 710 |
|---|---|---|
| SIGN DIST1 - SIGN DISTN | SIGN_DIF1 - SIGN_DIFN | RANK1 - RANKN |

Fig. 7

| 820 | 822 | 824 |
|---|---|---|
| LENGTH OF BINS LW | AMPLITUDE Apeak | NUMBER OF RANKS Nrank |

| 826 | 828 |
|---|---|
| LENGTH OF DICTIONARY Lrng | SEED OF RNG S |

| 830 | 832 |
|---|---|
| CURRENT RANK R | MAXIMUM OF BINS MAXr FOR RANK r |

| 834 |
|---|
| MINIMUM OF BINS MINr FOR RANK r |

| 836 |
|---|
| NUMBER OF SAMPLES OF DICTIONARY SEQUENCE Nr FOR RANK r |

| 838 |
|---|
| NUMBER OF ITERATIONS FOR OUTPUT/INPUT SUBSTITUTIONS Nreq |

| 206 | 208 |
|---|---|
| LENGTH OF BINS (LW) | PEAK AMPLITUDE (Apeak) |

| 300 |
|---|
| NUMBER OF LEVELS FOR RANK (Nrank) |

| 302 |
|---|
| NUMBER OF DICTIONARIES (NUM_DICT) |

| 842 |
|---|
| CURRENT DICTIONARY NUMBER (DICT_N) |

| 844 |
|---|
| LIMITS TO SELECT DISTANCES FOR THE NEXT DICTIONARY |
| NUMBER (Lup, Llow) |

| 846 |
|---|
| LENGTH OF THE CURRENT DICTIONARY NUMBER (LD_N) |

| 848 | 850 |
|---|---|
| INDEX BASE | SEED FOR CURRENT DICTIONARY NUMBER (S_N) |

| 852 | 854 |
|---|---|
| CURRENT RANK (r) | AVERAGE OF BINS Ar FOR RANK r |

| 856 |
|---|
| NUMBER OF SAMPLES IN BINS Nr FOR RANK r |

| 858 |
|---|
| MAXIMUM MAXr, MINIMUM MINr OF BINS FOR RANK r |

Fig. 10

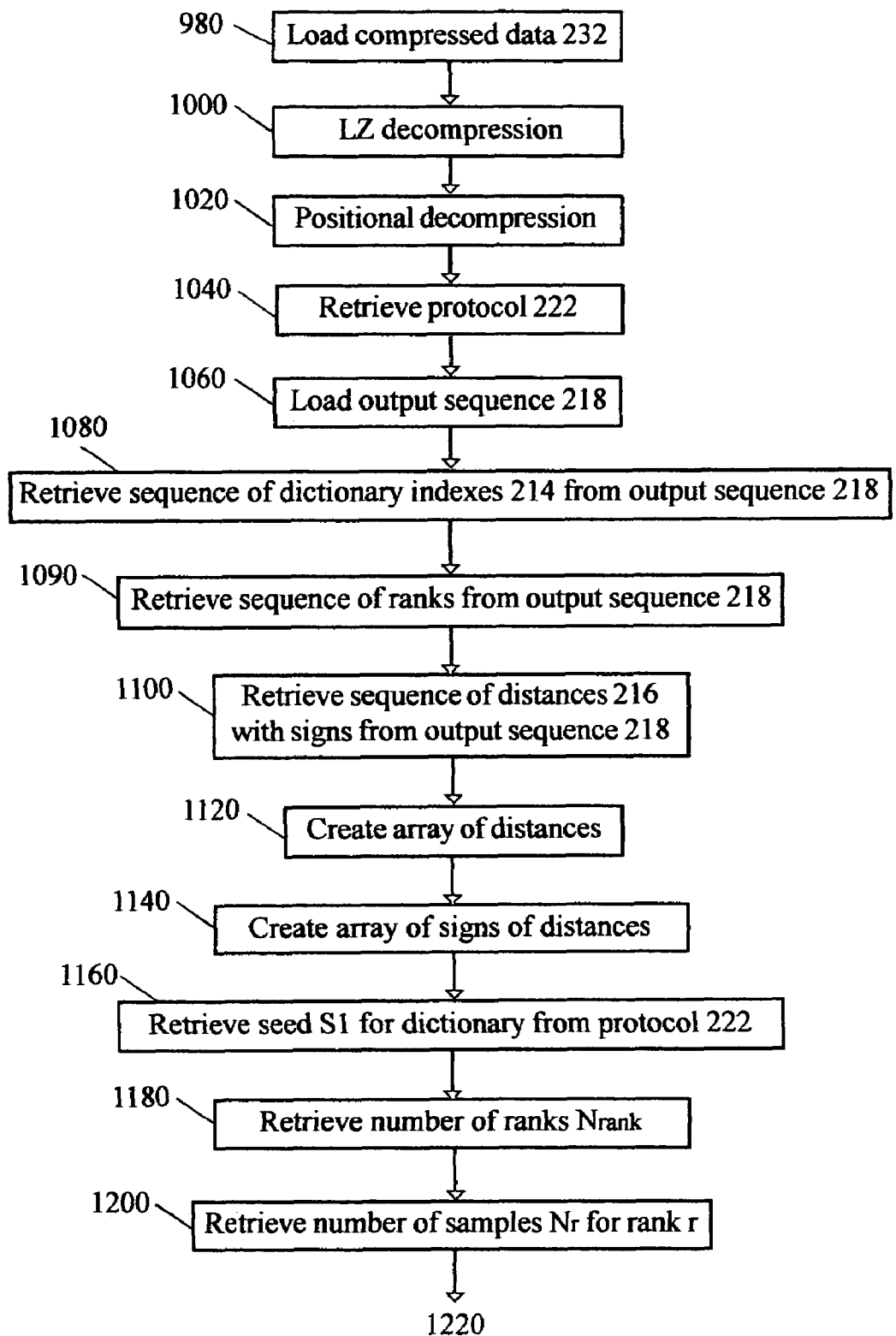
Fig. 11 (continue)

METHOD OF COMPRESSION OF BINARY DATA WITH A RANDOM NUMBER GENERATOR

CROSS REFERENCE TO RELATED APPLICATION

The invention in the present application is a continuation-in-part of the U.S. patent application Ser. No. 10/243,196, filed Sep. 13, 2002, now U.S. Pat. No. 6,674,908, which claims the benefits of U.S. Provisional Patent Application Ser. No. 60/377,683, filed May 4, 2002.

GOVERNMENT INTEREST

STATEMENT AS TO RIGHTS UNDER FEDERALLY SPONSORED RESEARCH

Non-applicable

SEQUENTIAL LISTING OR PROGRAM

Computer programs are provided on CD-ROM in two identical copies: COPY1 and COPY2.

FIELD OF THE INVENTION

The invention relates to dictionary based data compression and encryption, and more particular to coding and transformation of input data to reduce a space for storage and transmission.

BACKGROUND OF THE INVENTION

The term "data compression" refers to the process of transforming a set of data into a smaller compressed representational form, so that it occupies less space on a storage or that they can be transmitted in less time over a communications channel.

The trends in the data processing require to deal with multimedia communication and data storage with hundreds terabytes of data; to transmit data through communication channels with a limited bandwidth; to use handheld and portable devices (like cell telephones, digital cameras, airborne sensors) with limitations for memory and energy consumption. A computer performance is improving very fast every year, and more effective methods of data processing are feasible. All these challenging applications require the new solutions for improved and fast methods of lossless data compression.

DESCRIPTION OF RELATED ART

Many techniques have been used over the years to compress digital data. However they all based on the same few basic principles: a statistical coding, a dictionary coding, and an orthogonal series expansion (see: Salomon D. Data Compression. Springer, 2000, that is incorporated here by reference).

The U.S. patent application Ser. No. 10/243,196 filed Sep. 13, 2002 'Method of Binary Data Compression with a Random Number Generator' relates to a new method of data compression with an approximated matching between an input and an adaptive dictionary, produced with a Random Number Generator (RNG). An operation of a fast search with an adaptation in a small area of dictionary produced least distances between ordered both input and dictionary samples, instead of an exhaustive search in a large area in the prime art. This method compresses as the data without a special statistical redundancy in a feasible period of time. The subject matter of said application is incorporated be reference herein.

The current application is continuation-in-part of the aforementioned application Ser. No. 10/243,196, with a new accelerator, utilizing a content addressable memory (CAM), to increase significantly a speed of a particular operation of searching of said least distances between input and dictionary samples, and without a compromise of the rate of the data compression. An analysis of the prime art in the application Ser. No. 10/243,196 is incorporated here by reference; the new prime art related to the continuation-in-part is provided in the current application.

The problems of a rate and a speed of data compression are interconnected in practice, because to achieve a higher rate of compression so many operations were required with an exhaustive search of matching between a dictionary and an input sequences. If the process of compression is too slow, this operation may be considered as commercially inoperable for a particular application. There are examples of prime art that are uncertain neither to compress general type of data, nor to provide a solution to achieve an appropriate speed.

A problem to improve an operation of data compression with an approximated matching between tokens was addressed in the prime art, but is considered as impossible to solve. A review of these methods was published in: D. Modha, Codelet Parsing: Quadratic-time, Sequential, Adaptive Algorithms for Lossy Compression, Data Compression Conference, DCC-2003, Los Alamitos, Calif., IEEE, 2003, p.p. 223–231, that is incorporated here by reference. As was cited in this publication "universal lossy source coding scheme with attractive computational complexity aspects will never be found . . . at this stage of research it is not known if our algorithms are universal for some classes of sources".

U.S. Pat. No. 6,191,710 (Waletzki) 'Data Compression and Decompression Method and System for Data Compression and Decompression' (Feb. 20, 2001) utilized a search of a common random binary pattern between an input string and a random generated string, both with unknown statistical distribution. This process of search is considered as currently impossible to accelerate with available computer means, as was cited in par.20 page 7 of said patent.

The different approach of statistical coding, that is described in the prime art as Lempel-Ziff method of data compression, requires: a) a number of repetitions in the input sequence, matched by an dictionary; b) inclusion some form of the dictionary sequence in the output, c) a memory buffer-large enough to use repetitions, but not large to deteriorate a process of matching, d) upgrading a sliding window byte by byte, e) exact match between tokens of sequences in an input window and a dictionary. For example, the letters 'b' and 'c' do not match, and the compression will fail, while the difference between them in ASCII code is only one bit.

An example of implementations of these methods that paid the special attention to improve the speed of data compression described in US application 2003/0117299 (Jones) filed Jan. 22, 2001, which is incorporated here by reference. This prime art utilized a CAM with a feedback to an upgraded dictionary from a previous compression cycle, and searched for the best match between successful portions of data ('tuples') and a dictionary. Data loaded by every one successful tuple, and to achieve a compression, at least one byte in the tuple has to be matched exactly with a dictionary that was created from the previous blocks of data. This prime art was recommended for small blocks of data (par.0070 p.4), that will reduce a rate of data compression.

Accelerated Lempel-Ziv (LZ) compression with a hash look-up, that is an implementation of CAM, was described further in: R. Williams, 'An Extremely Fast Ziff-Lempel Data Compression Algorithm', Data Compression Conference, Utah, DCC-1991, IEEE, Los Alamitos, Calif., 1991 (p.p. 362–371), that is incorporated here by reference. A hash transformation was used for an exhaustive search of exact matching between strings in a memory buffer. The process of matching is comprised by pointers with offsets and lengths of the matched strings.

As CAM is utilized, its address is uniquely associated with a code of a dictionary sample; as a result, fast logical comparison could be performed simultaneously for the whole block of data. If requested CAM is large, it is difficult to use a high-speed memory (cash memory or an array of registers).

Those skilled in the art recognize that a speed of an operation is resulted not only by an algorithm of compression, by a speed of processor, and a size of the random memory, but also by many other factors: the number of exchanges between a fast and small cash memory and a main memory, number of exchanges between a main memory and a hard drive, number of paging in the virtual memory, as a page of physical memory downloaded to a hard drive, and by a throughput of buses between these units. With a large search buffer, these factors limit the speed of data compression.

In view of the above deficiencies of known data compression methods, it is thus desirable to achieve the next goals, that can result in a considerable competitive advantage, which are addressing by the present invention: to utilize a CAM with a reduced address space; to perform scanning of CAM for an approximate matching between the input and the dictionary; to use a fast memory for CAM; to reduce a number of operations in the search cycle of the least distances between both dictionary and input sequences.

SUMMARY OF THE INVENTION

The shortcomings of the prior art are overcome and additional advantages are provided through the provision of an accelerated method of an lossless data compression, with an approximated matching between input samples and a number of adaptive dictionaries, comprised by a RNG produced with a frequency distribution that is similar to a distribution of the input data. A fast search performed in a buffer of CAM that is scanned to find a sample of a dictionary to produce the least distance between said input and dictionary samples. The best dictionary is selected as an operation of the consequent refinement. The input sequence substituted with indexes of selected said dictionary samples and said distances. This method compresses as the data without a special statistical redundancy, as the data already compressed by the prime art that was considered impossible in the prime art, in technically feasible period of time.

The current invention accelerates further the process of data compression data compression, packing said CAM buffer with marking bits, indicating a presence of a dictionary sample with an address associated with an amplitude of said sample. The cycle of scanning of said buffer started with an address that is equal to amplitude of a successful input sample, and stopped as a first marking bit is found to assign an offset between these two addresses to a least distance. This operation is fast, because it is performed with fast bitwise AND comparisons in the area of fast memory (a cash memory or an array of registers).

Further acceleration of the operation of data compression is provided with a search cycle performed for a sequence of sub-ranges (slices) of amplitudes, thereby said buffer of CAM packed better for every consequent step, while a smaller size of said CAM can be used. Further acceleration is provided as a number of operations in a search cycle reduced with a ranking code assigned to both dictionary and input samples, thereby a successful search cycle started with a dictionary sample, having a ranking code corresponding to a ranking code of the current input sample. Neither the rate of compression, nor a decompression process is affected by the current invention. All objects, features, and advantages of the present invention will become apparent in the following detailed written description

BRIEF DESCRIPTION OF THE DRAWINGS

The following detailed description of an illustrative embodiment when read in conjunction with the accompanying drawings, wherein.

THE BEST MODE FOR CARRYING OUT THE INVENTION

Definitions

Input data—binary data, representing a text, an image, an executable file, a database formatted data, or any other unspecified coded data.

Input Numerical sequence—numerical data, representing binary input data after numerical formatting of every group of bits into the number.

Block of the input numerical sequence (BINS)—a group of consequent samples of the Input Numerical Sequence.

Index of an input sample—the position of a sample in the BINS.

Rank—the discrete variable, measuring the amplitude of the numerical sample.

Block of the dictionary—the group of consequent samples of the dictionary.

Index of a dictionary sample—the position of a sample in the block of the dictionary sequence.

Output data—compressed data, stored in a memory mean or sent to a communication channel.

Positional compressing—data compression by means of packing of consequent number of bits from a sequence of smaller samples into fixed size memory cells.

Statistical compression—data compression, for example a Hoffman coding, by means of assigning of the code labels to input data in accordance with the frequency distribution of these input samples.

Dictionary compression—data compression by substituting of the input sequence with the labels, described by the position of the input sample with a matched subsequence in the dictionary.

LZ compression—dictionary compression with a look-ahead buffer, in an attempt to find a match between sub strings of an input file and said buffer, which filled with the results of the previous similar operation.

Random number generator—a software, or a hardware mean to generate a sequence of numbers by an operation of iterative numerical computations, that satisfy a predetermined statistical criteria of randomness.

Decompressed data—output of the decompressing operation to restore input data.

Volume of information—amount of memory occupied by a sequence, calculated as a product of the length of said sequence by either the average or the maximum number of bits in a sample of said sequence.

Encryption—transformation of the input data into the form, that prevent from unauthorized reading of the transformed data.

Level of protection of the input data—the process of encryption of the input data, measured by the amount of time required for an operation of decryption of the data by an unauthorized user.

Packing—shifting bits in an addressable memory cell until the whole length of this cell is filled with said bits. This operation is the same as a positional compression.

Slicing—dividing a range for an amplitude for a predetermined number of sub ranges.

CAM—content addressable memory, with an address of a cell of this memory is associated with a value, like amplitude of a sample, rather than a content of this cell.

The Basics of the Method

Figure 1A:
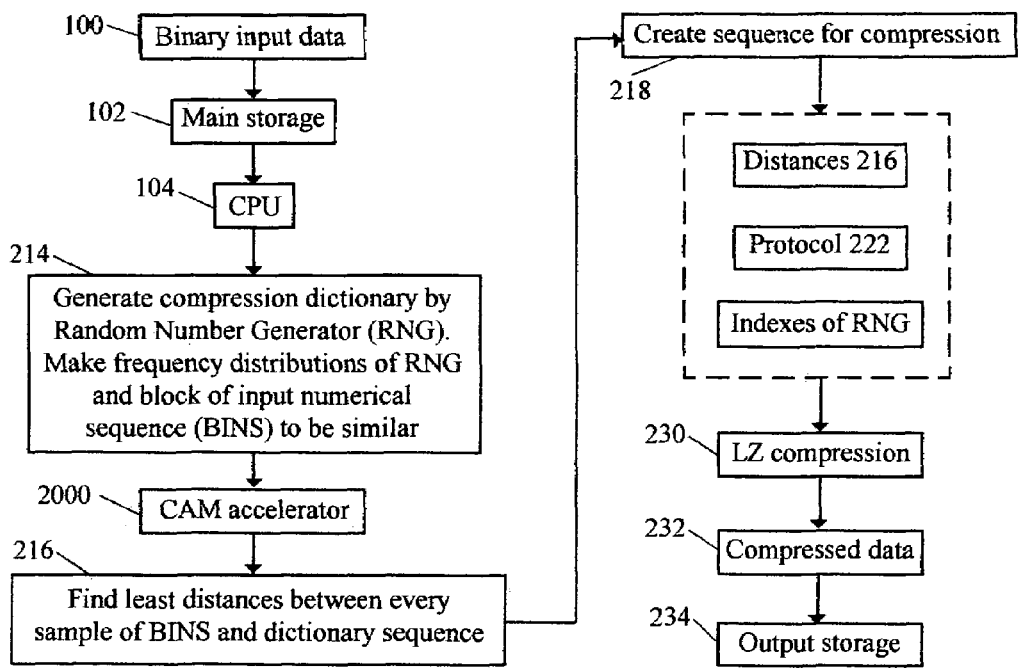
FIG. 1a is the block diagram of a preferred embodiment of the lossless compression with a search acceleration, and FIG. 1b—decompression process, incorporating a calculated dictionary, adapted to a frequency distribution of the input file, and a search accelerator, utilizing CAM, in accordance with the principles of the present invention.

Referring to the drawing, FIG. 1*a* shows the block diagram of a preferred lossless data compression process with acceleration for the current invention. In one embodiment, the input data 100 is retrieved from the main storage 102 that incorporated and used in a computing system, such as the one depicted in FIG. 1. Computing system includes, for instance, one or more central processing units 104, and a storage system 234. As is known, central processing unit (CPU) 104 is the controlling center of computing system and provides the sequencing and processing facilities for Instruction execution, interruption action, timing functions, initial program loading and other machine related functions.

The central processing unit executes at least one operating system, which as known, is used to control the operation of the computer by controlling the execution of other programs, controlling communication with peripheral devices and controlling use of the computer resources. The storage and transmittal facility of the present invention is, in one embodiment, controlled by the operating system. Main storage 102 may be either physically integrated with the CPU 104 or constructed in stand-alone units. The output storage system 234 includes one or more of a variety of input/output devices, such as, for instance, communications controllers, on-board devices, magnetic storage media (e.g., tape, disks), and sensor based equipment. Data is transferred from main storage 102 to the output storage system 234. The present invention can be used within other computing environments without departing from the spirit of the present invention.

Prior to compression, the data to be compressed 100 is transformed by a numerical formatting procedure to the sequence of numerical equivalents of the input data. Although not shown explicitly in FIG. 1, an input data file is first broken into blocks of some particular size, preferably around 16 bits. Each block is then transformed into associated numerical equivalent with predetermined peak amplitude, preferably around 65536. A number of these samples, optimally about 10,000, consequently stored in a BINS. An addressable memory area used for the BINS to speed-up the process of compression.

Extensive software simulation of the compression method was performed during the development of the present invention. Various values of all parameters, including the length of the BINS and the dictionaries, the peak amplitude of the samples, the number of levels (ranks) to select samples by the amplitudes from the BINS after compression with first dictionary for the next dictionary,—were tested to determine their impact on throughput and compression ratio. The particular format and the set of parameters in the preferred embodiment were selected to optimize performance.

A compressing dictionary 214 is generated by a RNG. This RNG generates a short sequence of samples of the dictionary, which changes in the same whole range of changes, as the numerical sequence of the input data. Frequency distribution of the dictionary sequence is transformed to be similar to the frequency distribution of the input sequence; as a result the dictionary sequence changes not only in the whole range of changes of the input data, but even in all sub ranges of the whole range. In the beginning of the process of the data compression, parameters of this RNG are predetermined. A length of the RNG selected to be sufficient to produce enough different samples to match approximately to the multiple amplitudes of the input numerical sequence. The peak amplitude of the dictionary 214 is smaller than the length of the dictionary. The length of the dictionary is preferably compatible with the length of the BINS. The input numerical sequence algebraically compared with this RNG sequence.

The operation of 2000 provides an acceleration of the search of the best match between successful BINS and the sequence of dictionary samples to find a least distance. The next operation 216 finds the least distance between an every consequent sample of the BINS and a sample of the dictionary sequence (the 'best' one), that produced this distance. This dictionary sample identified by its index. Said distances are small, and they occupy only little memory. The input data is substituted with the sequence 218, comprised of the sequences of least distances 216, and the protocol 222 and the indexes of RNG 214.

As a result, the sequence 218 should occupy less space in the memory, than the original input sequence. Another positive effect of the operation 216 of approximation of the input data is that the originally uniformly distributed BINS with large amplitudes and a small number of repetitions is transformed into the sequence, that concentrates near of the zero and has many repetitions. This improves the performance of statistical or LZ dictionary compression 230 to produce the compressed sequence 232, which is then sent it to the output storage 234. These operations are described in detail below.

Described above process can be repeated several times in a loop, and an output sequence is encrypted, because a redundancy of the input data removed from the output data, and the samples of the RNG used not in the order they were generated, but in an actually random order to approximate the BINS. As a result, the process of encryption is more secure, then the encryption of the original data. Any known encryption methodology can be applied further. It will be obvious to those skilled in the art, that a sequence of the protocols can be encrypted, stored or transmitted separately and differently from the compressed file of the distances and indexes of the dictionary, to improve the level of protection further. The various other changes of the encryption process may also be made therein without departing from the spirit and scope of the current invention.

The predetermined and calculated parameters of the process of compression accumulated in the area of memory that comprised the protocol 222, which described in details bellow. The compressing dictionary 214 is not a part of the output data, which increases the efficiency of present invention: once the least distances 216 are found, the dictionary 214 is eliminated from the memory, because it can be reproduced any time for decompression with the protocol 222.

Figure 1B:
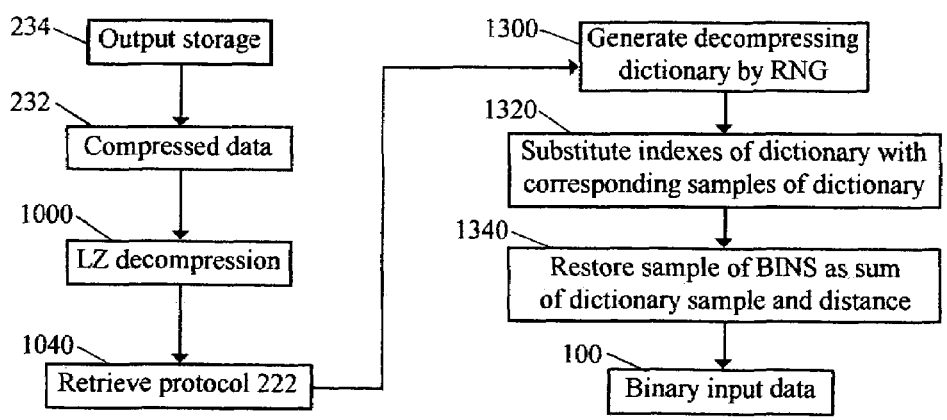
FIG. 1b is the block diagram of a preferred embodiment explaining a basic concept of utilizing CAM.

Referring to the drawing, FIG. 1b is the block diagram of the preferred operation of the data decompression for the current invention. Compressed data 232 is extracted for the output storage 234, and the operations are performed in the order opposite to that used for compression (compared with FIG. 1a), starting from LZ decompression of the data 1000. The parameters to generate RNG are extracted then from the protocol 222. As a result, the generated by RNG decompression dictionary is exactly the same, as the compression dictionary 214. The dictionary is a table of the samples and the corresponding indexes, and this table used for an inverse operation. The indexes of RNG retrieved from the compressed data 232, substituted with the correspondent samples of RNG that algebraically added to the distances in the operation 1104 to restore the input data. As a result, the processes of compression and decompression are completely reversible, and input data 100 restored.

Figure 1C:
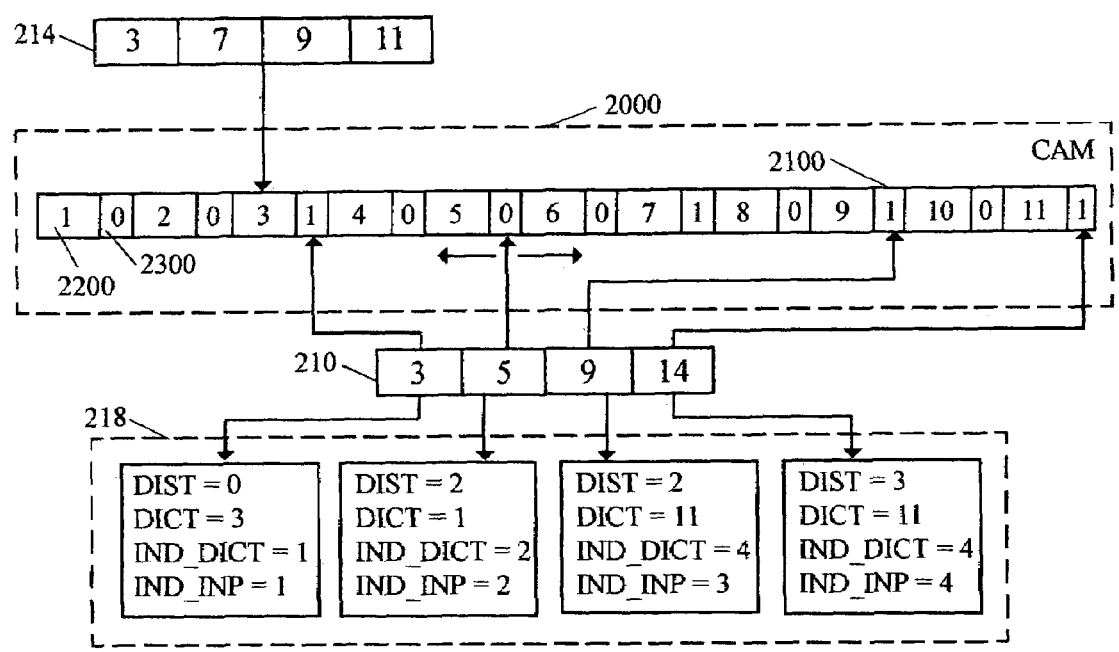
FIG. 1c is the block diagram explaining the basic concept of CAM.

FIG. 1c explains the basic concept of an accelerator of the approximated search 2000, utilizing CAM. A dictionary sample 214 is loaded in CAM 2100 with an address 2200 for a memory cell, associated with an amplitude of this sample (in a simple case—they are just equal). To find a best match for a sample of BIN, the address for look-up is associated with amplitude of BIN sample 210. If these samples are equal, their contents 2300 in addresses 2200 are equal too, and the least distance is zero. If a dictionary sample does not exist in the location equal to the amplitude of BIN sample, this operation is scanning the adjacent CAM cells, until it finds a mark, indicating a dictionary sample. The offset between both the addresses of BIN and the found dictionary sample is the least distance that is included in the output sequence 218. Operation of search 2000 performed with fast bitwise logical 'AND' comparisons simultaneously for a sequence of cells. The address space for a search in CAM is small, so a fast cash memory or an array of registers can be utilized.

The teaching of the current invention is provided in the disclosure, with attached two identical copies of CD with the programs to accelerate the search of the least distances between in input and a dictionary sequences, that are incorporated here by reference. Said CDs each contains three ASCII files: the program EXTSLICE.TXT (acceleration with sliced amplitude) 7,023 bytes, the program EXTPACK.TXT (acceleration with packed memory cell) 8,190 bytes, and the program EXTSEARCH.TXT (acceleration with an adaptive search cycle) 3,865 bytes. Said programs were tested in PC IBM with OS Windows XP, and SAS Programming Language ver.8, developed by SAS Institute Inc. (SAS Campus Drive, Cary N.C. 27513).

The Operation of Compression in Detail

Figure 2:
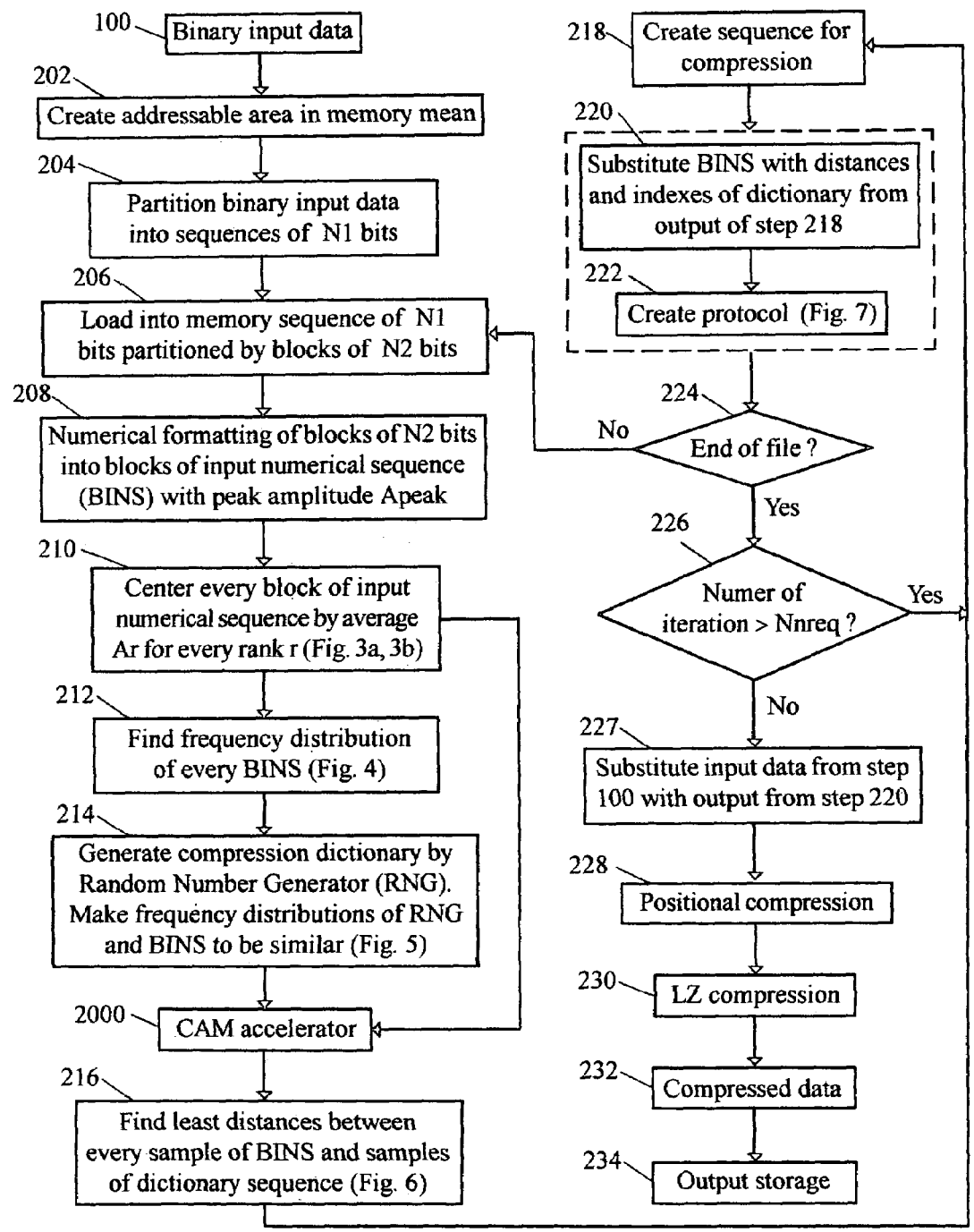
FIG. 2 is the block diagram of a preferred logic of the major operations in detail, utilizing CAM for an approximate matching binary data, transformed to blocks of numerical input sequence (BINS), with a random adapted dictionary, and a CAM accelerator, in accordance with the principles of the present invention.

Referring to the drawing, FIG. 2 is a block diagram of preferred lossless data compression with the detail explanation of the major flow-up of the process of compression, while all major operations described in the details bellow. The operation of compression started with creating of the BINS 202 in an addressable memory area to keep the consequent blocks of the input data. Objective of blocking of the BINS is to perform operations faster, with one input/output transaction, to work with a large input file using a small random memory of a micro-device. The blocks of binary samples consequently loaded in the memory.

The input data file partitioned into groups of N1 samples in step 204. For binary data, one sample could be a group of bits, or a memory word, for text data—a binary equivalent of any alphabet provided. As a result, this operation created a sequence of bits. In step 206 group of N1 samples loaded in the BINS and this sequence partitioned into blocks of N2 bits, preferably an about 16, with a numerical equivalent produced by the operation of numerical formatting in step 208 with a peak amplitude Apeak.

Those skilled in the art recognize that the values of all numeric or text parameters transformed from binary data and back, by a standard procedure, like with the ASCII code table. For example, 16 bits words produce the samples with the peak amplitude 65536. A numerical equivalent can be associated with every member of a sequence of any words or phrases by a formatting procedure. As a result of these steps up to step 208, the data that originally are not numerical, transformed to the numerical data, and any mathematical calculations could be applied now to these numerical samples (like addition, multiplication, division)—while it was senseless for the original text or binary data. For example, a sequence of words, with the numerical equivalents in brackets: 'glucose' (10), 'cholesterol' (12), 'lymphocytes' (14) has an integer average: round ((10+12+14)/3)=12, residuals are: −2,0,2.

Figure 3A:
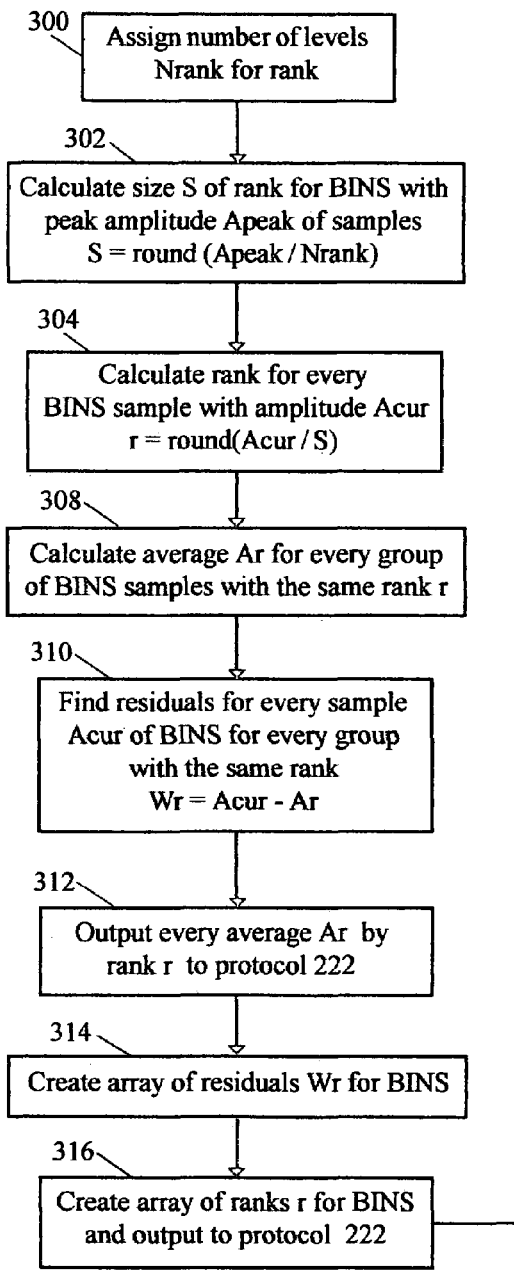
FIG. 3a is the block diagram of the preferred logic of operation of ranking and centering the samples of the BINS, in accordance with the principles of the present invention.

Objective of the next operation 210 is to transform the sequence with large peak amplitude to a sequence with a small range of changes that will improve an efficiency of the later steps of an approximation of the BINS by the dictionary sequence. A short-length sequence of RNG will cover better the BINS with a smaller range, than the original BINS. This transformation achieved by a centering of the BINS and dealing with the residuals, instead of the original BINS. The numerical samples classified by a level of current amplitude of every consequent sample that is the rank of every sample. Step 210 calculates these ranks, assigns the ranks to a block of input numerical samples, and centers the samples in a group with same rank by an average in this group. A table of the averages with the corresponding ranks outputted in the protocol 222. This operation of averaging is reversible, because the sequence of centered samples accompanied by a sequence of corresponding ranks, and with averages from the protocol, the original BINS could be always restored. FIG. 3a will describe this operation for a repeated operation of averaging.

Figure 4:
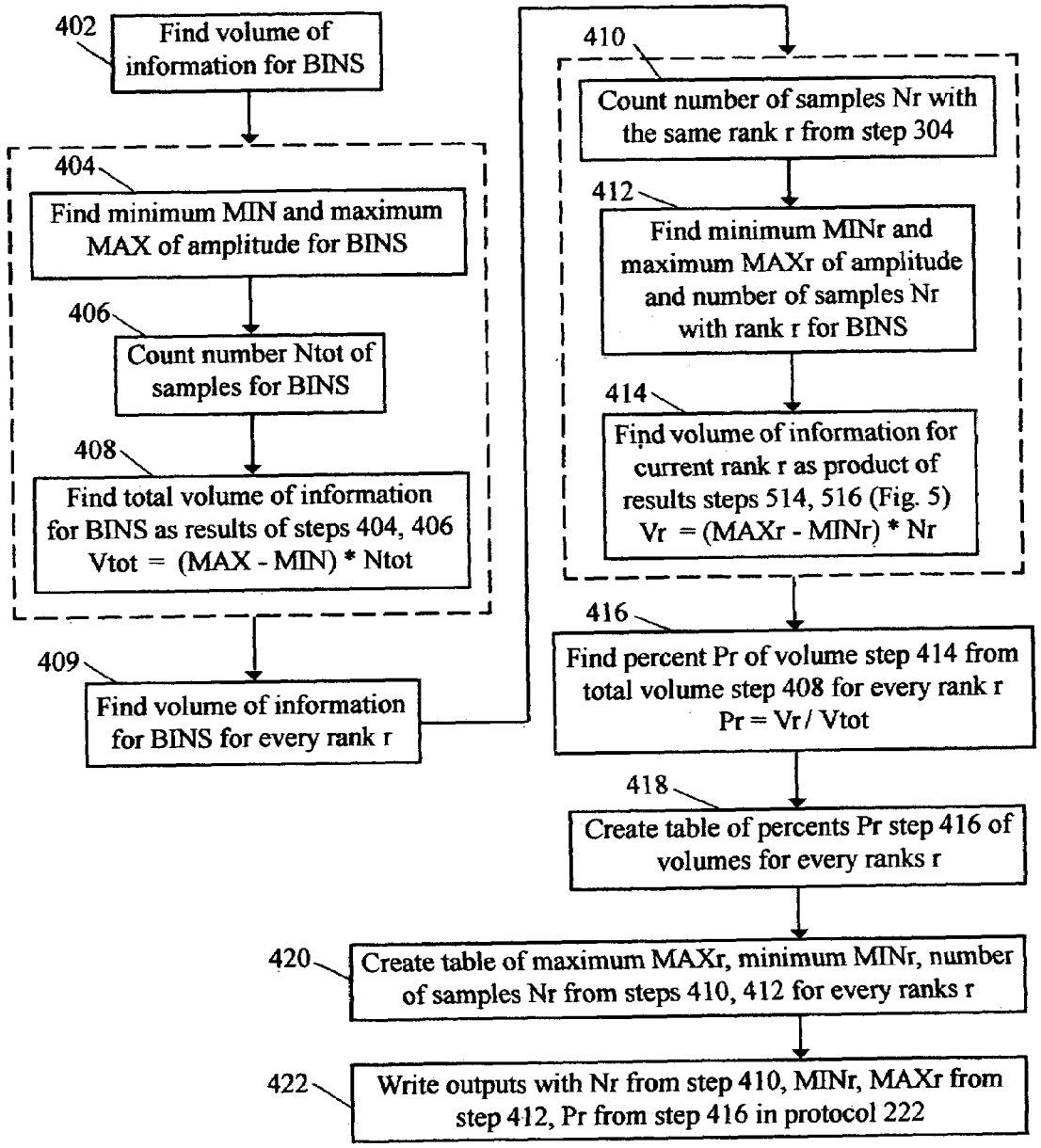
FIG. 4 is the block diagram of the preferred logic of operation to find the description of a frequency distribution of the BINS, in accordance with the principles of the present invention.

Objective of the next step 212 is to calculate and to describe a frequency distribution of the BINS. This distribution is calculated and described by the metrics, associated with sub ranges of the whole range numerical samples, and these sub ranges defined by a rank variable for the amplitude of the numerical samples, calculated in step 210. FIG. 4 will describe this operation with further details. Parameters of this distribution accumulated in the protocol 222, and used to generate the dictionary for compression and to restore the dictionary later for decompression.

Figure 5:
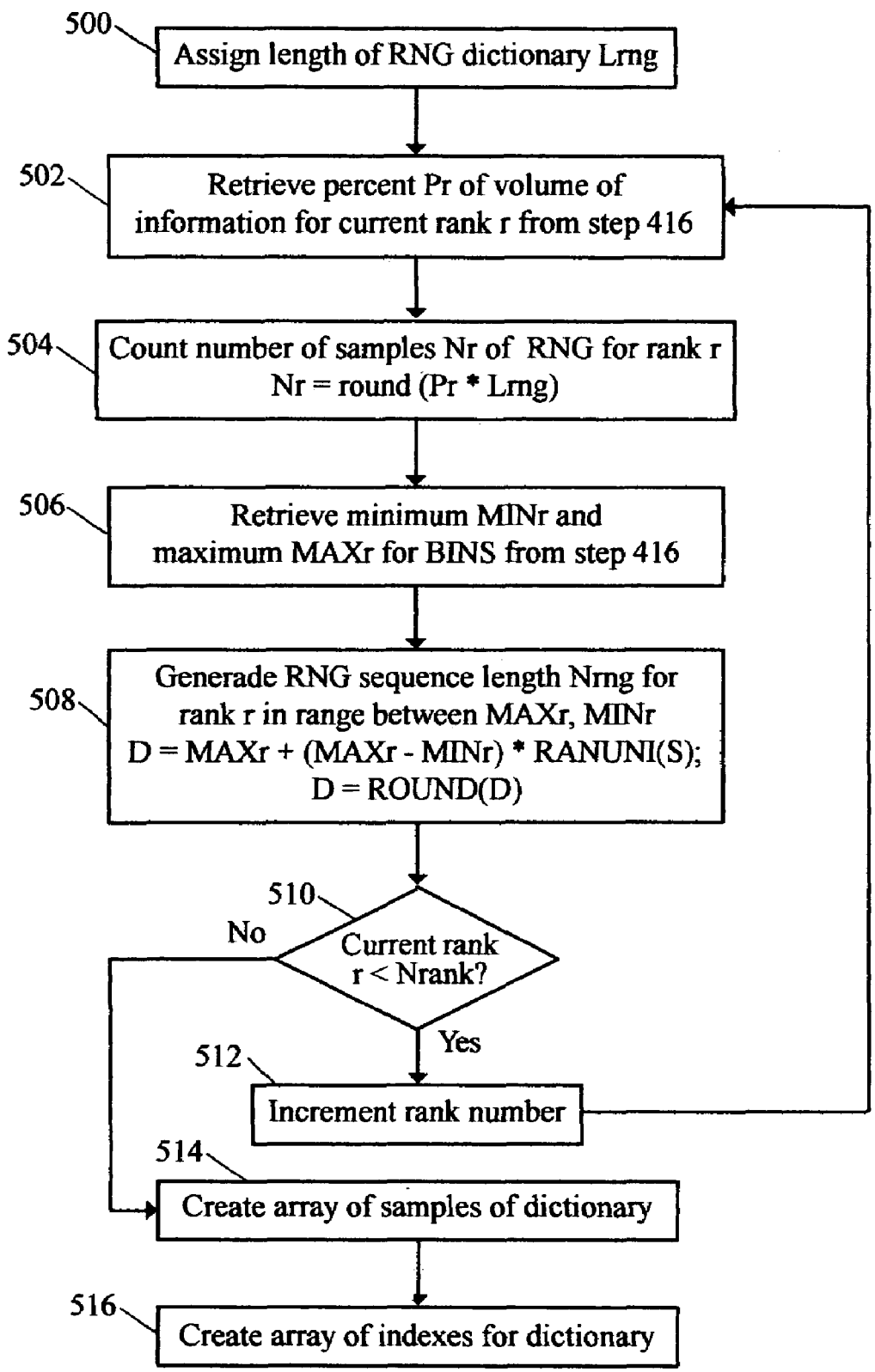
FIG. 5 is the block diagram for the operation of generating a compressing dictionary, in accordance with the principles of the present invention.

Operation 214 generates the dictionary by the RNG. Though the standard RNG generates the sequence of numbers between 0 and 1 with an uniform distribution, but with a scale transformation this sequence can be transformed to a sequence with a predetermined range and any different shape of distribution. FIG. 5 describes this operation with further details. A frequency distribution of the dictionary is transformed to be similar to the frequency distribution of the BINS. As a result, a sequence of samples of the dictionary is close by amplitudes to the BINS in the whole range of changes of its amplitude, and the random dictionary sequence effectively used to approximate the random input numerical sequence.

The length of the dictionary is an important resource of the current invention. If this length is small, the index, that describes a position of the dictionary sample in the generated dictionary, will be small too, and this part of the output from the procedure of matching the sequence 218 will occupy a small space in a memory. But a short dictionary could produce large outliers, because with small number of dictionary samples it is difficult to find the particular one, which will match a random sample of the BINS with a wide range of changes. As a result of extensive modeling, the length of the dictionary is recommended an about the same as the length of the BINS.

Operation 2000 with inputs from steps 214 and 216 accelerates the process of approximate matching between the dictionary and the BINS samples; this operation will be described bellow in details with FIG. 13–FIG. 16.

Figure 6:
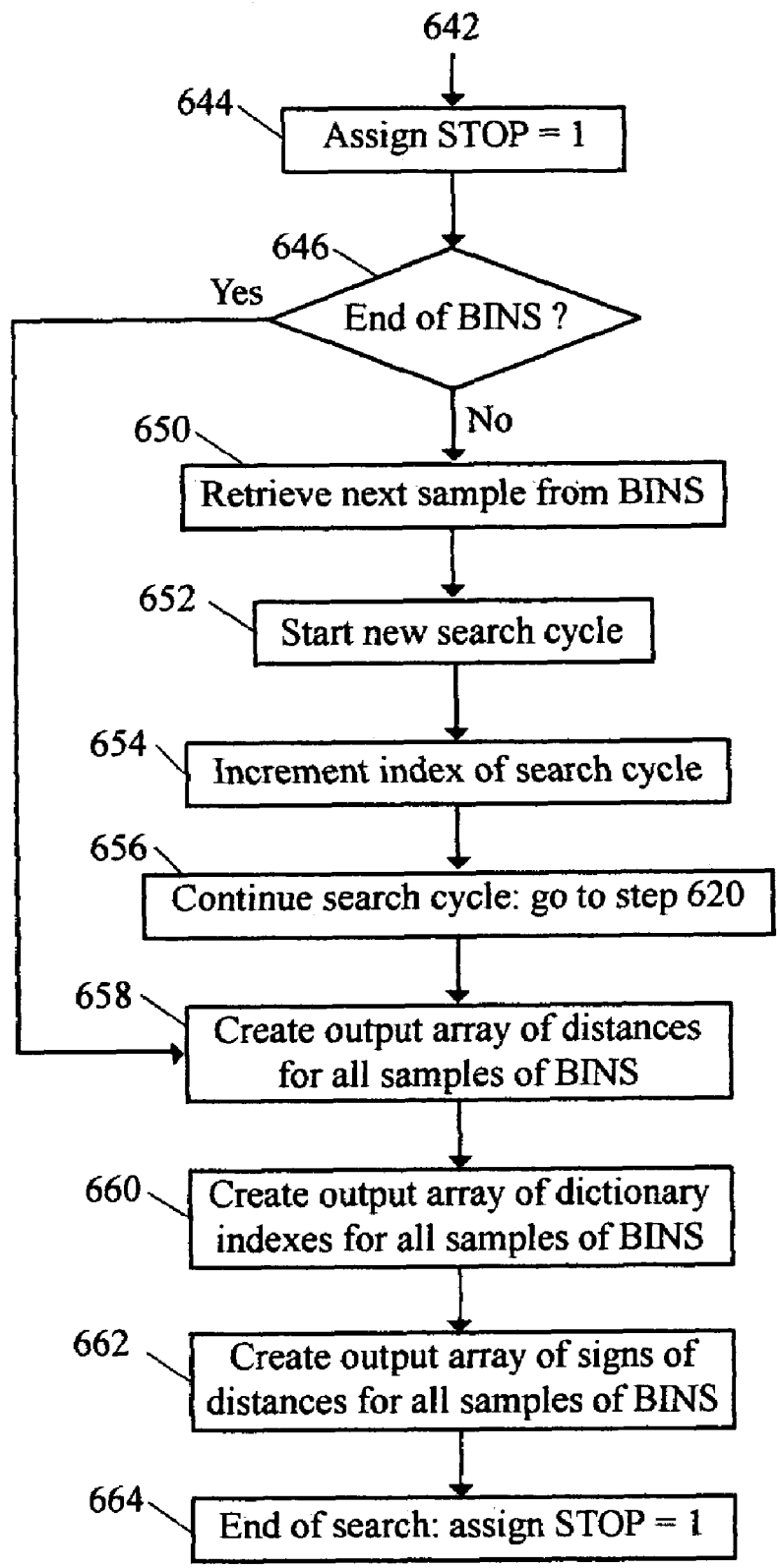
FIG. 6 is the block diagram for the operation of a preferred logic to find the least distances between the input and the dictionary sequences, with the operation of CAM accelerator of this search operation, in accordance with the principles of the present invention.
Figure 7:
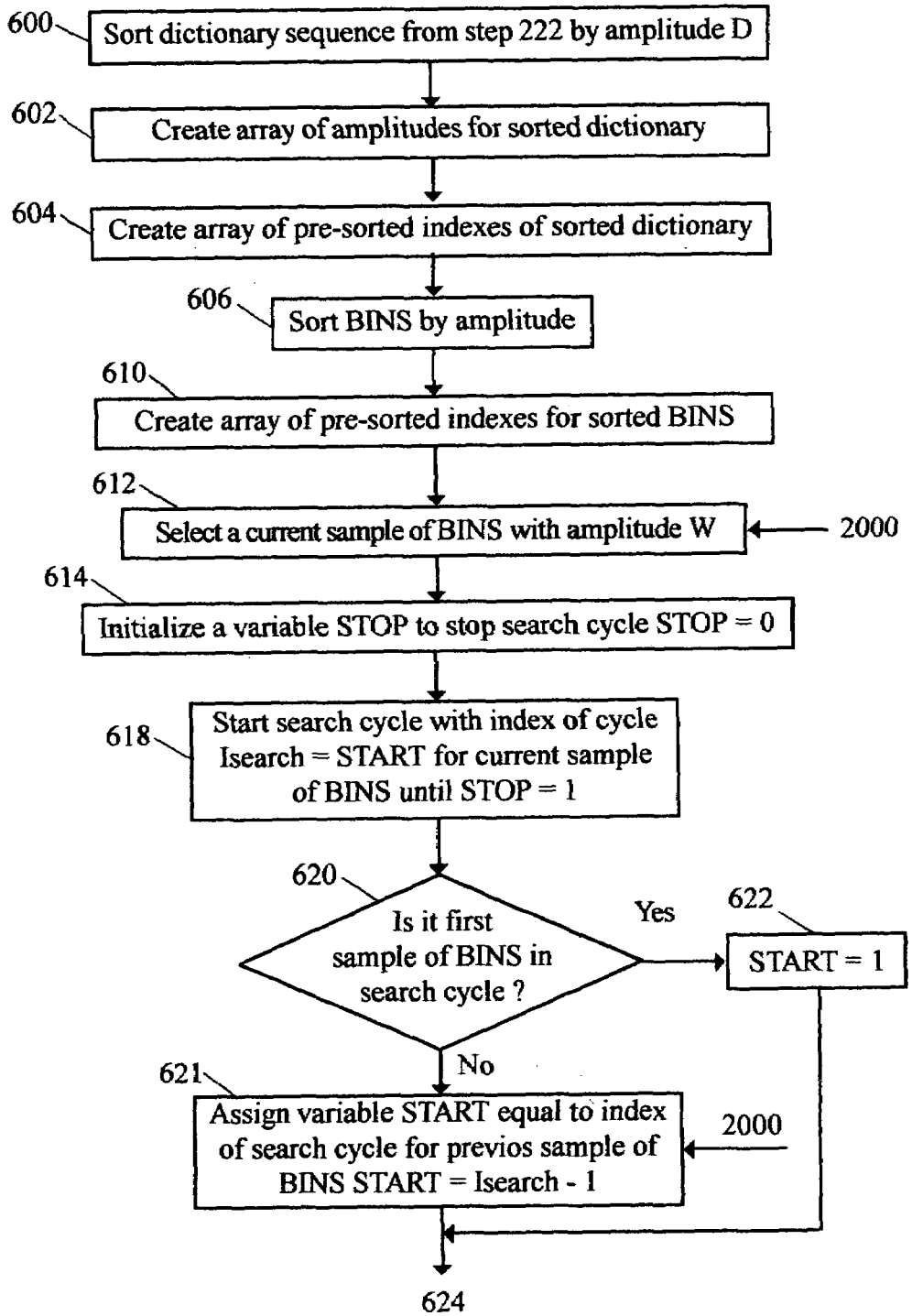
FIG. 7 depicts the example of the output data, before it is used for LZ compression, in accordance with the principles of the present invention.

As the next step, the dictionary used for the closest possible approximation of the random input data in the operation 216—to find the least distances between every sample of the BINS and the samples of dictionary sequence. FIG. 6 will describe this operation with further details. The next operation 218 creates the sequence for compression. This operation comprises of steps 220 and 222. Step 220 substitutes the BINS with the least distances, founded by step 216 and indexes of the samples of the dictionary that produced these distances. Step 222 creates a protocol that keeps the parameters of the frequency distribution from step 212, and all other parameters of the previous operations, to provide these operations are reversible for the operation of decompression later. FIG. 7 describes the protocol 222 in details.

Operation 224 checks, if the end of the input file reached. If 'No'—the new block of the BINS filled with the input data in step 206, and the operation continued. If 'Yes', the operation transferred to step 226 to check the next logical condition—a number of cycles to repeat steps 210–222. According to the current invention, the output from the operation of the data compression can be redirected to an input of the next cycle of the data compression. The number of cycles of compression compared with the predetermined number of iterations Nreq. Operation 227 substitutes the input data 100 with output data step 220, to repeat operations described in FIG. 2 by steps from 204 to 224 predetermined number of times Nreq. Predetermined number of iterations Nreq limits consumptions of the computer time and the rate of achieved compression.

The number of iterations defined by the trials and errors, according to a selected criterion: maximizing a compression ratio; minimizing duration of an operation; minimizing a time of transmission of compressed input data. If the logical condition 226 is true, the next operation is step 218 to create a new sequence for compression. As a result, the level of protection of data for ciphering and the rate of compression may be improved. The current implementation uses one cycle of this operation of substitutions.

The samples of many components of the output sequence 218 occupy only a part of a memory cell. In the next step 228 the output sequence 218 used as the input to the operation of a positional compression 228. The important part of the output is the subsequence of the distances. The peak amplitude of this subsequence could be three bits or smaller, so a memory cell of the memory mean, that could be 16 bits, is packed only partially, that provides an option to shift the samples in the memory cells—to pack this cell. As a result, the packed sequence will occupy less memory than the original output sequence. For example, the sequence of the distances: 3 2 0 2 has the binary representation: 11 10 00 10, that needs one byte of the memory for this whole sub string. The sequence of the signs is represented by the samples, that occupy only one bit each, and the operation of shifting packs the memory cells, that explained further bellow. An implementation of this concept will be explained bellow.

In accordance with the principles of the present invention, the redundancy of the input data treated as a redundancy of a difference between the BINS and the numerical dictionary; the latter covers the same range, with the same distribution, as the amplitude of the numerical input. As a result, the new sequence produced, that may occupy smaller space in a memory, but there are more options to improve the rate of compression. All samples of the distances concentrated near of the zero, indexes of the dictionary are small enough, and a published dictionary compression 230 methods, like LZ compression, could be applied more effectively to the generated output 218, than to the original input sequence.

The published dictionary compression mean is available in a number of off-the-shelf products, such as the WinZip for Windows, offered by WinZip Computing Co; COMPRESS, a package available in the Sun-UNIX operational system. The dictionary compression is also described in: Storer J. A. (2000), Data Compression: Method and Theory, Computer Science Press, which is hereby incorporated by reference in its entirety. LZ-compression is only one example, however. Any reversible transformation that allows statistical or dictionary compression can be used. Compressed data 232 is the final result of operations described by FIG. 2a and it is accumulated in the output storage 234.

Statistical Description of an Input Sequence

Referring to the drawing, FIG. 3a is a block diagram of a preferred operation to improve efficiency of the process of approximation of the BINS with the random dictionary sequence. The first step to achieve this goal was described by FIG. 2, as the BINS, that is random and has the wide range of changes, transformed to a sequence with a narrow range of changes, by means of centering the sequence in a sub range of the peak amplitude of the BINS.

This goal achieved further by means of calculation of a selected metric, describing a frequency distribution for every sub range. As a result, the dictionary approximates the residuals for very small sub range, and outliers are smaller. For this purpose step 300 assigns a number of levels Nrank for the rank r, that is recommended an about six. The next step 302 calculates the size of a rank as $S=\text{round}(A\text{peak}/N\text{rank})$ where S—a size of the rank, Apeak—a peak amplitude of the block of the BINS. The next step 306 calculates the rank for every BINS sample as $r=\text{round}(A\text{cur}/S)$ where r—a rank, Acur—an amplitude of a current sample.

The ranks assigns to the corresponding samples. The next step 308 calculates the average Ar for the samples with the same rank. Step 310 calculates residuals Wr for every sample of the BINS for an every group of samples with the same rank r as $Wr=A\text{cur}-Ar.$ Step 312 outputs every average Ar by ranks r to the protocol 222, to provide reversibility of the process for decompression, as it will be explained in more detail bellow. Further operations accelerated and simplified with the creation of arrays. Step 314 creates an array of residuals from step 310, step 316 creates an array of ranks from step 304, and step 318 creates an array of signs for the absolute residuals, calculated by step 310. As a result of this operation, the numerical sequence that has a wide range of changes, transformed to the sequence with substantially smaller range. Now the random dictionary sequence used to approximate the sequence with a small range, and outliers will be smaller too. With the arrays of signs, ranks and averages, this operation is completely reversible.

For example, let the BINS is: 98 105 103 32 98 114 111 119 110 32 100 111 103. The peak amplitude Apeak is 119. The size of the rank S=round (119/6)=20. The array of ranks, calculated according to step 304, is: 5 5 5 1 5 6 5 6 5 1 5 5 5. Grouping of the BINS samples by the rank could be not physical one, but by the pointers to the array elements with the same rank. For the rank 1 the average AV1=32, for the rank 5 AV5=104, for the rank 6 AV6=111. Residuals (absolute): 6 1 1 0 6 0 3 5 6 0 4 7 1 with the average=3 and the range=7. The sequence of signs of residuals is: −+−+−++−+−−−. The sequence of signs needs one bit for a sample.

Figure 3B:
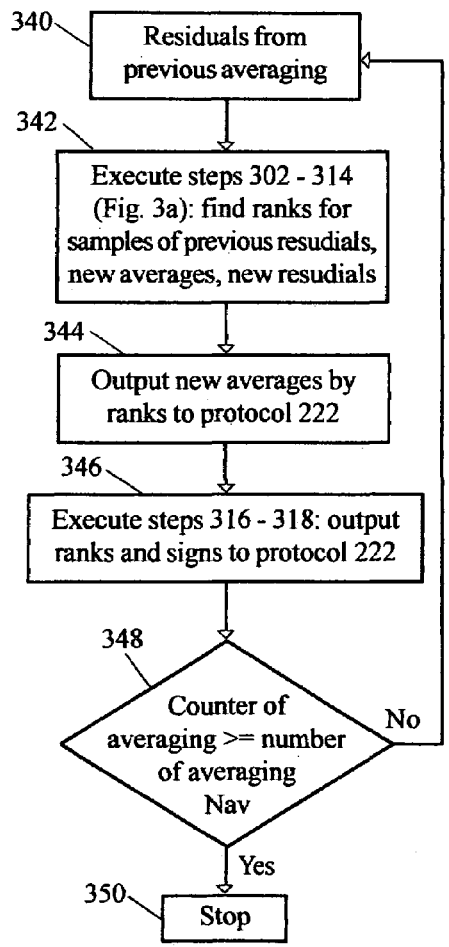
FIG. 3b is the block diagram of the preferred logic of multiple ranking and centering operations for the samples of the BINS, in accordance with the principles of the present invention.

This operation of centering by the ranks steps 308–314 can be repeated: the sequence of residuals after first centering can be treated in the same way as original input sequence, assigned with a sequence of new ranks, averaging by these new ranks and centering. Referring to the drawing, FIG. 3b describes this operation with further details. The next table of the ranks and the averages accumulated in the protocol 222, as well as a previous one, to provide a reversibility of the process of compression and decompression. A positive effect of this repetition is that residuals will be decreased, but a negative effect is that an additional space will be spent to keep a sequence of ranks for every cycle of centering.

Step 340 (FIG. 3b) accumulates residuals of the previous (after the first one) operation of averaging. Step 342 executes steps 302–314 (FIG. 3a): finds the ranks for samples of residuals, the averages, the residuals—for the current cycle of averaging. Step 344 outputs the averaging in the current cycle by rank to the protocol 222. Step 346 executes steps 316–318: output ranks and signs of residuals to the protocol 222.

Step 348 performs a testing: is a counter of averaging greater or equal than a predetermined number of averaging Nav? If the answer is 'YES', the cycle of averaging stopped. If the answer is 'NO'—goto step 340 to continue the cycle of averaging. A number of centering selected by a process of trials and errors for a particular application; in the current invention for a preferred mode one procedure of centering was used.

Referring to the drawing, FIG. 4 is a block diagram of a preferred operation in details to find the frequency distribution 212 (FIG. 2) for the transformed samples of the BINS. Objective of this step is to prepare the operation of the adaptation of the dictionary to the frequency distribution of the BINS. As a first step, the preferred embodiment uses the range of changes of the amplitude of this sequence and number of the samples in said range. The number of the ranges is predetermined; this number is the same as the number of ranks Nrank from step 300. This simple metric provides a high speed of the computer operations, while many different metrics could be applied too. The different methods to describe frequency distributions are provided in: Niederreiter H. Random Number Generation and Quasi-Monte Carlo Methods, Society for Industrial and Applied Mathematics, Philadelphia, Pa. (1992), and Knuth D. Art of Computer Programming, Vol. I, Addison-Wesley, Reading, Mass. (1982), which is hereby incorporated herein by reference in its entirety.

The rank, the number of samples and the range of the amplitude, related to this rank, describe the shape of the frequency distribution. While this description is simple, it is not the best for the preferred embodiment. The good metrics should assign more samples of the dictionary to an area of changes of the samples of the block of the BINS, where more outliers could be expected. In the preferred embodiment the present invention uses the composite metrics, as the product of the range of the amplitude by the number of samples related to a group samples with the same rank. This parameter named here as a 'volume of information'. As the next step, a percent calculated of the volume of information for every rank from the total volume of information for the whole range of changes of the amplitude of the BINS. A number of samples of the RNG generated according to this percent for an every rank, and an area with more changes of the BINS will have more samples of the dictionary to find a better approximation, as it is explained in details later.

Step 402 finds the volume of information for the block of the BINS and comprises the operations in steps 404–408. Step 404 finds a maximum (MAX) and a minimum (MIN) of amplitude of the samples in the BINS. Step 406 counts a number of samples Ntot of this BINS. Step 408 finds a total volume of information for this BINS as $$Vtot=(MAX-MIN)*Ntot.$$

Step 409 finds the volume of information for the BINS for every rank r, and comprises the operations in steps 410–414. Step 410 groups samples in the BINS by ranks, assigns in step 304. Step 412 finds the minimum MINr, the maximum MAXr of amplitude, the number of samples Nr with the rank r. Step 414 finds the volume of information Vr for the rank r as $$Vr=(MAXr-MINr)*Nr.$$

Step 416 finds the percent of the volume of information for the rank r from the total volume of information as $$Pr=Vr/Vtot.$$

Step 418 creates the table of the percents Pr calculated by step 416 for an every rank r. Step 420 creates the table of MAXr, MINr, Nr by the rank r, and step 422 output this table in the protocol 222. These tables used later to generate the dictionary with the shape of the frequency distribution that is similar to the frequency distribution of the BINS, and with the same ranges. For the above example, the number of the samples with the ranks 1,2,6: N1=2, N5=9, N6=2. The table of maximums and minimums by ranks: MAX1=32, MIN1=32, MAX5=111, MIN5=98, MAX6=119, MIN6=114. The volumes by ranks: V1=32*2=64, V5=111*9=999, V6=119*2=238. The total volume Vtot=64+999+238=1301. The table of percentages by rank: DCUR=64/1301=0.05, P5=999/1301=0.77, P6=238/1301=0.18. The number of samples of the RNG for the rank=1 N1=1, for the rank=5 N5=10, for the rank 6 N6=2. A maximum and a minimum in the group for the rank r described by the list (MINr, MAXr, r).

Generation and Adaptation of a Dictionary

Referring to the drawing, FIG. 5 is a block diagram of a preferred operation in detail to generate a compressing dictionary by RNG (operation of step 214, FIG. 2). Objective of this operation is to generate the dictionary sequence that is distributed similar to the distribution of the BINS. This dictionary covers the changes of the amplitude of the BINS in the sub-ranges. The length of the dictionary should not be made large, because in this case the average size of a sequence of indexes will be large too, and it will occupy the large amount of memory in the output sequence 218.

The preferred implementation uses the sequence of RNG in the best mode: the number of samples of the RNG will be greater for the ranks with increased percent of the volume of information. Step 500 assigns the predetermined length Lmg of RNG sequence for the dictionary, preferably an about 10,000, that is an about the same, as the length of the BINS. Step 502 retrieves the percent of the volume of information Pr for the current rank r from step 418.

Step 504 counts the number of samples of the dictionary for the current rank r as $$Nr=\text{round}(Pr*Lmg).$$

Step 506 retrieves maximum MAXr and minimum MINr for rank r for the BINS from step 416. Step 508 executes a standard program or a hardware mean that generates the RNG, with Nr iterations (number of dictionary samples for rank r) with an amplitude Dr (amplitude for rank r), according to the expression:

$$Dr=\text{MIN}r-(\text{MAX}r-\text{MIN}r)*RANUNI(S)$$

$$Dr=\text{round}(Dr)$$

where RANUNI (S)—a standard function to generate the random number sequence between 0 and 1 with uniform distribution and the seed S, that is predetermined initial value to start the iterations (at usually S=0). If the function RANUNI is equal 0, Dr is equal MINr, and if the function is equal 1, Dr is equal to MAXr.

The random number generators are available in a number of off-the-shelf products, such as MathCAD, offered by MathSoft Co.; SAS, offered by SAS Institute. The different methods to generate RNG are provided in: Niederreiter H. (1992), Random Number Generation and Quasi-Monte Carlo Methods, Society for Industrial and Applied Mathematics, Philadelphia, Pa., and Knuth D. (1982), Art of Computer Programming, Vol. II, Seminumerical Algorithms, Addison-Wesley, Reading, Mass., which is hereby incorporated herein by reference in its entirety. Hardware means for generating the RNG described in U.S. Pat. No. 6,351,539 (Djakovic), which is hereby incorporated herein by reference.

Steps 510 provides repetition of the operation to generate a sequence by the RNG with the assigned number of samples and statistical description for steps 502–508 for every rank. It checks the logical condition: is the current rank number less than the predetermined number of ranks Nrank from step 300? If 'YES'—goto step 512 to increment the rank number and after that—goto step 502 to repeat an operation to generate RNG for the next rank r. If 'NO'—goto step 514 to create an array of samples of the dictionary for samples Dr and step 516 creates array of indexes of these samples in the dictionary. As a result of these operations, described by FIG. 5, the dictionary created, as a numerical sequence, that closely match the numerical sequence in the BINS: the maximum and the minimum of the dictionary are the same as for the BINS, and the shape of the frequency distribution is similar. If there is greater the volume of information in a particular sub-range of the BINS data, the dictionary has more samples there.

Approximation of the Input Sequence by the Dictionary

Referring to the drawing, FIG. 6 describes the best mode of preferred operation 216 in detail to find the least distances. The objective of the operation 216 is to prepare a substitution of the large and random samples of the BINS, having an unpredictable number of repetitions with small, concentrated near of zero, sequence of distances between these samples and the samples of the dictionary, and with many repetitions.

The problem here is that because both sequences (the BINS and the dictionary) are random, traditional analytical tools of approximation are not efficient. This problem solved in the preferred implementation by means of an operation, that for an every current sample of the BINS searches through the whole dictionary sequence to find the sample with a least distance between these two samples—of the BINS and of the dictionary. This operation can be described by the SQL programming language, that used by skilled in the art, and it is available in a many off-the-shelf products, such as Microsoft Access 2000 Data Base, offered by Microsoft Co.; SAS, offered by SAS Institute. The description of this language is provided although in: Celko J. SQL for Smarties: Advanced SQL programming, Morgan Kaufmann Series in Data Management (1999), which is hereby incorporated herein by reference in its entirety.

Here is description of the SQL program to find the least distance between samples from two sequences in SAS SQL version 8.01 (SAS is a programming package, and different dialects of the programming language differ insignificantly):

proc sql noprint;
create TABLE DISTANCE as
SELECT DICT.SAMPLE_DICT,

BINS.SAMPLE_BINS, DICT.IND_DICT, BINS.IND_BINS,
BINS.RANK_BINS, DICT.RANK_DICT, ABS(DICT.SAMPLE_DICT-BINS.SAMPLE_BINS) as DIST

From DICT, BINS
group by SAMPLE_BINS
having calculated DIST=MIN(DIST);
quit;

where DICT—dictionary table, comprises of retrieved variables: samples (SAMPLE_DICT), indexes (IND_DICT), and ranks (RANK_DICT); DICT—BINS table, comprises of retrieved variables: samples (SAMPLE_BINS) indexes (IND_BINS) and ranks (RANK_BINS); DICT.SAMPLE_DICT, BINS.SAMPLE_BINS—variables SAMPLE retrieved from the corresponding tables.

This operation performs the grouping operation by the BINS samples, one by one, calculating the distances between an every BINS and all the dictionary samples, and finding the least distance for every particular pair of the selected sample of the BINS and all dictionary samples. Output table DISTANCE created by this operation with the samples of the BINS, least distances, and correspondent samples of the dictionary and indexes of the dictionary and the BINS. The advantage of this operation that it is compact and can be quickly used without extensive debugging and programming efforts by the skilled in the art.

This operation could require to keep different combinations of calculated intermediate data, and as a result it could be more suitable for powerful computers. For personal computers, used in a regular business practice, or micro processing means, the current invention uses in the preferred mode an accelerated operation of approximation of the random input by the random dictionary that described in details bellow.

Accelerated Approximation

Referring to the drawing, FIG. 6 describes the best mode with the preferred operation 216 in detail to find the least distances, that is very fast and requests a small amount of a temporary memory for execution. The principle of this operation is to sort both the tables: the BINS and the dictionary sequences, and to use a guided search for the small portions of the sequences, instead of an unguided exhaustive search for the large sequences. This operation performs the cycle of the search with the conditions to start and to stop a current cycle, adapted to the results of both the previous and the current search cycles. After both sequences (of the dictionary and the BINS) sorted, the arrays of indexes of these sequences, which keep the positions of the samples before sorting, saved. As a result, any sample can be identified by its position in the original sequence, and this operation of sorting is reversible.

For every current sample of the BINS, the search cycle started with the best sample of the sorted dictionary, that produced the least distance in a previous search cycle. Because both these sequences (the dictionary and the BINS) sorted, the dictionary samples, located before this best one, could produce only greater distances and therefore useless for this search cycle. Further, every consequent distance for the current BINS sample compared with a distance, produced by the previous dictionary sample for the same BINS sample. If the current distance is bigger, the search cycle can be stopped, because for the sorted sequences the next distance could be only even bigger. A search cycle with the described adaptation is more effective than an exhaustive search, drastically reducing the number of operations.

As the new search cycle is started, the next sample from the BINS is not smaller, than the previous one (again, because this sequence is sorted). The samples of the dictionary do not need to be retrieved in the current search cycle, if they positioned before the dictionary sample, used to start the previous search cycle, because the distance could be only bigger.

The detailed description of the operation step by step according to the FIG. 6 provided bellow. Operation of sorting used for both BINS and dictionary sequences before the search cycle started. This operation of sorting is very fast, and good designed sorting programs are available in many off-the-shelf products, as MathCAD, offered by MathSoft Co; Microsoft Access 2000 Data Base, offered by Microsoft Co.; SAS, offered by SAS Institute. The different methods of sorting are provided in: Knuth D. (1982), Art of Computer Programming, Vol. III, Sorting and Searching, Addison-Wesley, Reading, Mass., which is hereby incorporated herein by reference in its entirety.

Step 600 sorts the dictionary sequence by an amplitude D, and step 602 creates an array of these amplitudes to accelerate the operation. Step 604 creates an array of pre-sorted indexes of the dictionary. Step 606 sorts the BINS by the absolute amplitude. Step 610 creates an array of pre-sorted indexes for the sorted BINS. These array provided acceleration of the search cycle. Arrays of presorted indexes 604 and 610 (of the dictionary and the BINS) used later to restore the dictionary and the BINS to the original form before sorting, after the search cycle will be finished. The search cycle comprises two loops: an outer one—to select a consequent sample of the BINS and an inner one—to select a sample of the dictionary that produced the least distance from the sample of the BINS. Step 612 selects in the outer loop the current sample of the BINS, starting with the first one.

The process of adaptation of the search cycle guided by two assigned memory cells: numerical START—for the beginning of the search cycle, and logical STOP—for the end of the search cycle. The variable START has a value of a number of a dictionary sample for the inner loop. Step 614 initializes the variable STOP=0. If this variable assigned to the value STOP=1, this condition stops the cycle of the search before an end of the array of the dictionary will be reached, as it described bellow.

The state of the search cycle for a current sample of the BINS identified by an index of this cycle Isearch. An index of the search cycle for a previous sample of the BINS identified as Isearch-1. Step 618 starts the search cycle from the value of the index of the search cycle Isearch that is assigns as equal to the variable START, and stops, if either from these two conditions satisfied: the end of the dictionary reached, of variable STOP=1. Step 620 checks a logical condition: is it the first sample of the BINS in the outer loop 612? If the answer is 'No', step 621 assigns the value of the variable START equal to the index of the search cycle, before this search cycle stopped for the previous sample of the BINS: START=Isearch-1. If the answer is 'Yes', step 622 assigns the value START=1. Step 624 retrieves the current sample Dcur of the dictionary array 602 and the search cycle is ready for an execution.

Step 626 calculates the current distance DIST1 as an absolute difference between the current sample Dcur from step 624 of the dictionary array and the current sample W from step 612 of the BINS as $DIST1 = abs(W-Dcur)$.

Step 630 retrieves a previous sample Dprev of the dictionary array 602 in the current search cycle. Step 632 calculates the previous distance DIST2 from steps 612,630 as an absolute difference between the sample Dprev and the current sample of the BINS array as $DIST2 = abs(W-Dprev)$.

Step 633 checks a logical condition: is the current dictionary sample Dcur started to be equal or greater than the current sample W of the BINS? If this condition is true, this search cycle should be stopped, because a next dictionary sample will produce only even greater distance with the current sample of the BINS. The next question to answer now, what distance is smaller—from the current dictionary sample (Dcur), or from the previous one (Dprev)? To find this answer, step 634 checks a logical condition: is the current distance bigger than the previous one: DIST1>DIST2? If the answer is 'YES'—GOTO step 636, if 'NOT'—GOTO step 654. Step 636 assigns a minimum distance to output DIST as DIST=DIST2. Step 638 assigns the index IND in the array created by step 604 of the corresponding dictionary sample Dprev as an output dictionary index that produced the least distance.

Step 640 assigns the sign of distance as '1' if W>Dcur. Step 642 assigns variable START to the previous value of the index of the current search cycle: START=I prev that is preparation for the next search cycle. Step 644 assigns variable STOP equal 1, because the least distance for the current dictionary sample found and the next search cycle prepared, and the cycle can be stopped. Step 646 checks a condition: is it an end of the BINS?—to change the logic of the search cycle: if the answer is 'YES'—GOTO 658 for the output, if 'NO'—GOTO step 650 to continue this operation with the new search cycle. Step 650 retrieves the next sample from the BINS. Step 652 starts the new search cycle with the command GOTO step 614. Step 654 increments the index of the search cycle. Step 656 continues the search cycle with command GOTO 620. Step 658 creates output array of distances for all samples of the BINS. Step 660 creates output array of indexes for all samples of the BINS. Step 662 creates output array of signs of the distances for all BINS samples. Step 664 performs the end of the search with the assignment STOP=1.

This operation, described in FIG. 6, is provided by the program EXTSEARCH.TXT on attached CD with the comments. The program was designed according to described method, using SAS Programming Language. For testing the described operation was used to find the least distances between two sequences (the BINS and the dictionary) with a buffer for 10,000 samples. This operation used the personal computer IBM PC, OS Windows XP, processor Pentium 4, total physical memory 256 Megabyte, local fixed disk 25 Gigabytes. The described above accelerated operation in the same computer showed the drastically improved performance—many hundred and thousands times faster than SQL operation, with small losses of time for sorting. For some applications the speed is as important as a rate of compression, and an accelerated implementation described bellow.

Layout of the Output File and the Protocol

Referring to the drawing, FIG. 7 is a block diagram of a preferred operation in detail to generate the output sequence from step 218. Field 700 describes the consecutive number of the BINS BINS_I. Field 702 describes the sequences of the distances DIST1–DISTN for every consequent BINS_I. Field 704 describes the indexes IND_D1–IND_DN of the dictionary sequence for every consequent BINS_I, field 706 describes the sequence of sings of the distances for every consequent sequence if distances SIGN_DIST1–SIGN_DISTN, field 708 outputs signs of the differences after centering the BINS_I, for all consequent BINS numbers SIGN_DIF1–SIGN_DIFN, field 710 describes the sequence of the ranks RANK1–RANKN for all BINS_I.

Figure 8:
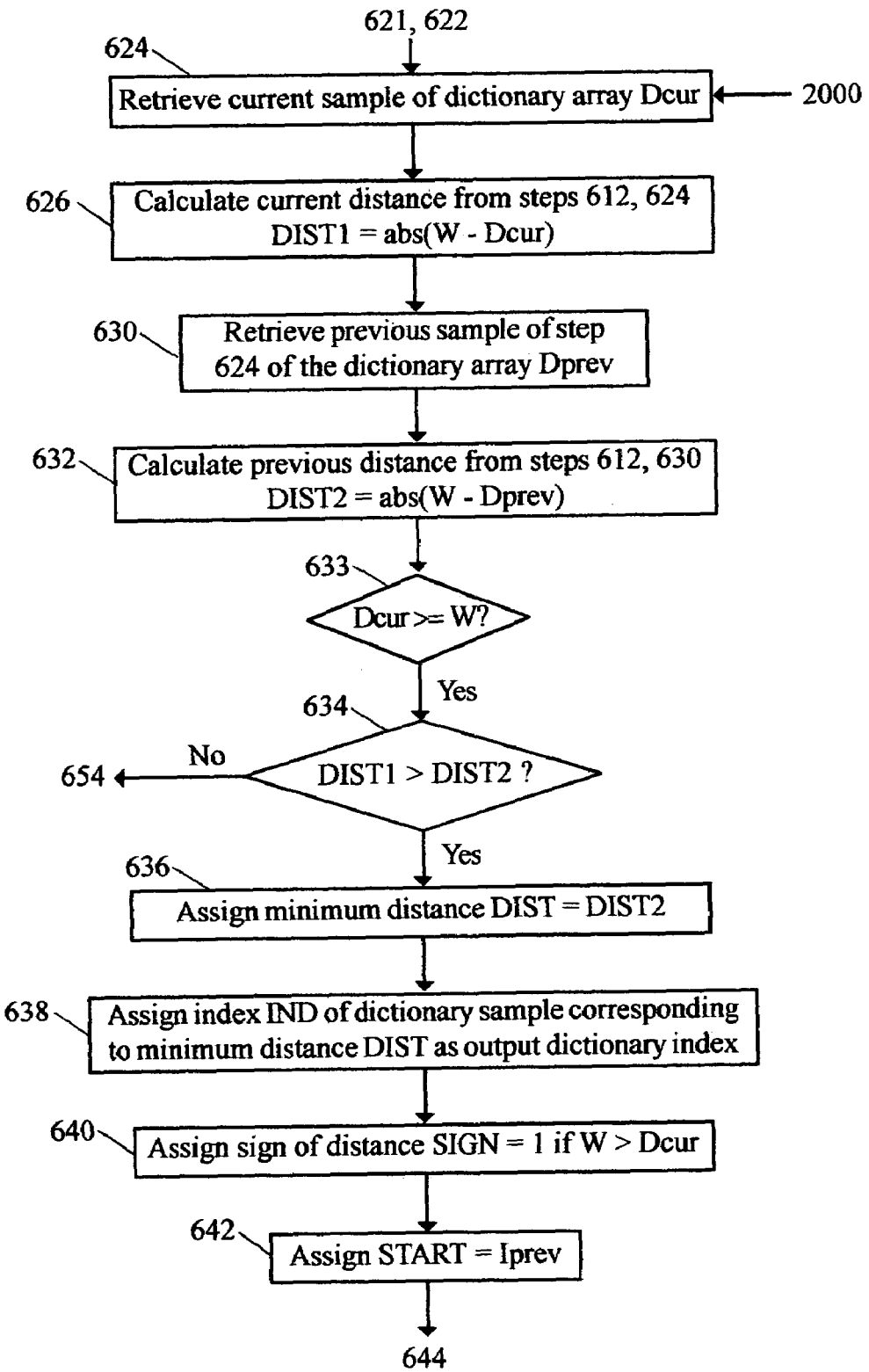
FIG. 8 depicts one embodiment of the process compression protocol, in accordance with the principles of the present invention.

Referring to the drawing, FIG. 8 is a block diagram of a preferred operation in detail to generate the protocol 222. The protocol accumulated two types of parameters: predetermined, related to the process of assigning of the initial values to the parameters, and calculated, related to the process of calculations. These parameters comprise: the length of the BINS 820 (created by step 208) LW; the peak amplitude Apeak of the BINS 822 (created by step 208); the number of levels for the ranks Nrank 824, (assigned by step 300); the length of the dictionary Lrng 826, (assigned by step 500); the seed S of the RNG 828 (assigned by step 500), the current rank r 830; the maximum of the BINS MAXr 832 for the rank r; the minimum of the BINS MINr 834 for the rank r; the number of samples of the dictionary sequence Nr 836 for the rank r. Fields 832, 834, 836 accumulated by step 422 FIG. 4. The number of the iterations for output/input substitutions Nnreq accumulated in the field 838 (assigned by step 218).

Consequent Refinement with Multidictionary Compression

Both the BINS and the dictionary sequences are random, even the least distances could be too big for some particular samples of the BINS, so the rate of compression will be deteriorated. An alternative dictionary could produce the better results for some different groups of samples, but even worse—for others. Referring to the drawing, FIG. 9 is a block diagram of a preferred operation in detail to solve this problem for a further improvement—to provide a consequent refinement with a multi-dictionary procedure of the data compression.

After the first dictionary used to produce the sequence of the least distances, a selection mean retrieves the samples of the BINS with distances that are larger than a predetermined level. The next dictionary adapted to the frequency distribution of the selected samples, and a new sequence of least distances generated. A comparison mean selects the samples with the smaller least distances from these two sequences produced by two dictionaries for the correspondent BINS samples. The new output sequence generated with the selected least distances and the indexes of samples of a selected dictionary that produced the corresponding selected distances.

The output sequence contains a marker to identify, what particular dictionary was used for the selected sample. This marker predetermined to be unique for every dictionary. The present implementation counts indexes of every dictionary with a different base—to assign the different range of the indexes for every dictionary. The base of the indexes of a particular dictionary used as the marker to identify this dictionary. The process of the consequent refinement can be repeated with many dictionaries. It is recommended for the current implementation to use two dictionaries.

Figure 9:
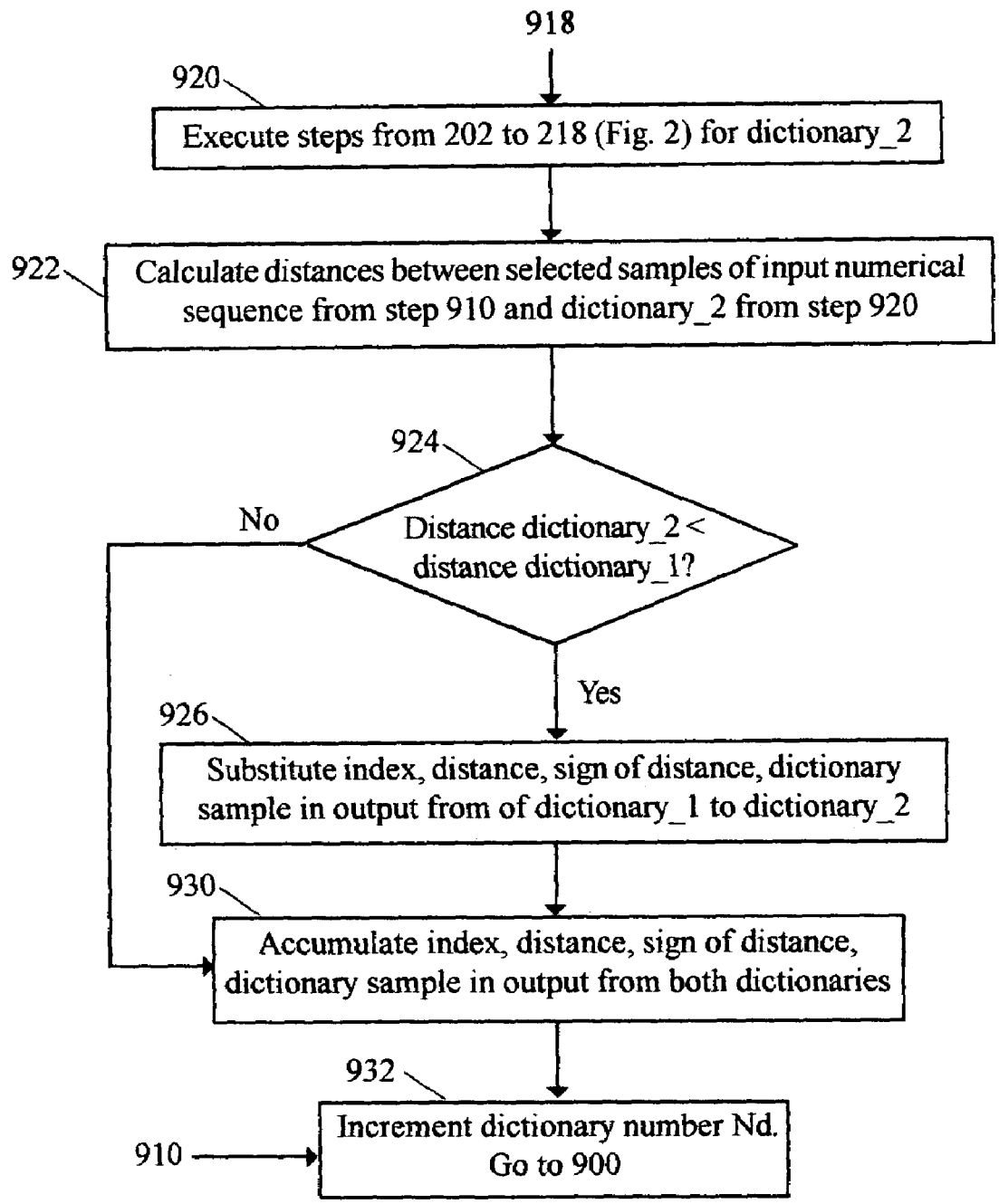
FIG. 9 depicts one embodiment of the consequent refinement of the process of compression with more than one compression dictionaries, in accordance with the principles of the present invention.

Referring to FIG. 9, this operation describes the process of the consequent refinement with two dictionaries. Step 900 assigns the dictionary number Nd, starting from the first one. Step 902 assigns the length for every dictionary Nd; preferably to select a length for the first dictionary an about 0.9 from the length of one dictionary operation (step 500). For multi-dictionary operation it is recommended to select every consequent dictionary with a length an about 0.1–0.2 from the length of the dictionary with one-dictionary operation. Step 904 assigns the seed for the first dictionary S1=0, and for a consequent dictionary number Nd, the seed Sd could be any random number; the purpose of the optional new seed is to avoid of possible correlation between dictionaries. Step 906 executes steps from 202 to 218 from FIG. 2 for the dictionary_1. As a result, the next sequences produced: of the least distances, indexes of the first dictionary, and the samples of the first dictionary, corresponding to the least distances.

Step 908 assigns the limits Lup and Llow for the upper and bottom levels, to select the distances, satisfied to these conditions after the first dictionary executed. Step 910 is a selection mean to check the logical condition: Lup>Distance>Llow?—to select the samples with the big enough distances, produced by the first dictionary. The percent of distances with large outliers at usually is small, and the remaining samples will not substantially spoil a statistical compression applied later. At the same time, the range of selected distances should not be too broad, to achieve the best result with the short next dictionary. It is recommended to select the distances between an about 0.6 (Llow) and 0.9 (Lup) from the maximum distance produced by the first dictionary.

Step 912 fills an array of the samples of the BINS corresponding to the distances selected by step 910. Step 914 creates array of indexes of the BINS samples corresponding to these selected distances (with the condition 'YES'). Step 916 retrieves the length of the dictionary_2 (from step 902). Step 918 assigns the base of the index for the dictionary_2. This parameter is related to the length of the dictionary_1. For example, if the length of the dictionary_1 in step 902 is 9,000, then the base in step 918 can be selected as 9,001. As a result, the indexes in the outputted sequence 218 are identified in a unique way—what number of the dictionary produced any particular sample. Step 920 generates the dictionary_2 from steps 212 and 214 and executes steps from 202 to 218 FIG. 2, with indexes starting from the selected base by means of assigning the beginning of the cycle in step 508. This second dictionary statistically adapted to the frequency distribution of the selected samples of the BINS, just like the first dictionary was adapted to the whole BINS.

Step 922 executes steps from 202 to 218 from FIG. 2 to find the distances between the BINS samples selected by step 910 and the dictionary_2. Step 924 is a comparison mean to check the logical condition: is the distance from dictionary_1 (after step 906) greater than the distance from the dictionary_2 (after step 922)? The samples with the smaller of the least distances from these two dictionaries will be selected in this step for the corresponding samples of the BINS. Step 926 substitutes the distance, the sign of the distance, the index of the dictionary sample in the output sequence with these parameters corresponding with the dictionary samples that produced the smaller distance.

Step 930 accumulates the sequences of distances, signs of these distances, ranks, and indexes from both dictionaries. The ranges of indexes for the different dictionaries are different (because the base is different); as a result, the dictionary that produced a particular distance can be identified in the process of decompression later. The process of the consequent refinement can be repeated with multiple dictionaries by step 932. Extensive modeling showed that an operation with two dictionaries reduced an average for 20% of outliers up to ten times.

Layout of the Protocol for Multidictionary Compression

Figure 10:
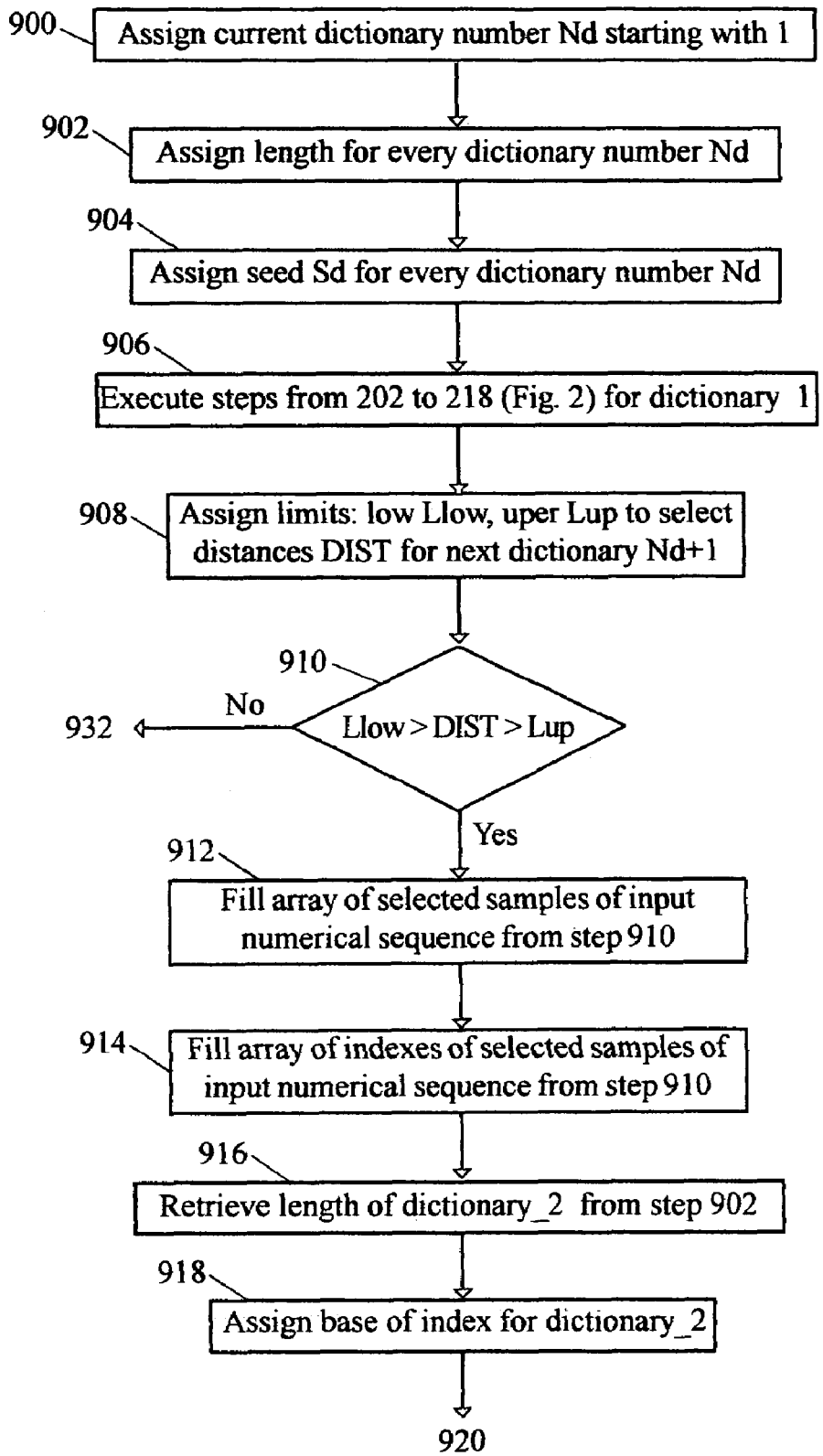
FIG. 10 depicts one embodiment of the protocol described the process of lossless compression using multiple compression dictionaries, in accordance with the principles of the present invention.

Referring to the drawing, FIG. 10 is a block diagram of a preferred operation in detail to generate the protocol 222 for a multi-dictionary operation, comprising: the length of the BINS 206, the peak amplitude of the BINS Apeak 208, the number of levels for rank Nrank 300, the number of dictionaries NUM_DICT 302, the current dictionary number Nd 842, the limits Lup, Llow to select distances for the current dictionary number Nd 844, the length of the current dictionary number LD_N 846, the base of the index of the current dictionary number 848, the seed for the current dictionary number 850, the current rank r for the BINS in the operation for the current dictionary 852, the average Ar for the BINS 854, the number of the samples Nr 856 in the BINS, the maximum and the minimum MAXr, MINr 858. The fields with an index 'r' related to a rank r. This information is complete to generate later any consequent decompression dictionary, that is exactly the same, as was generated during a compression operations.

Decompression with one Dictionary

Figure 11:
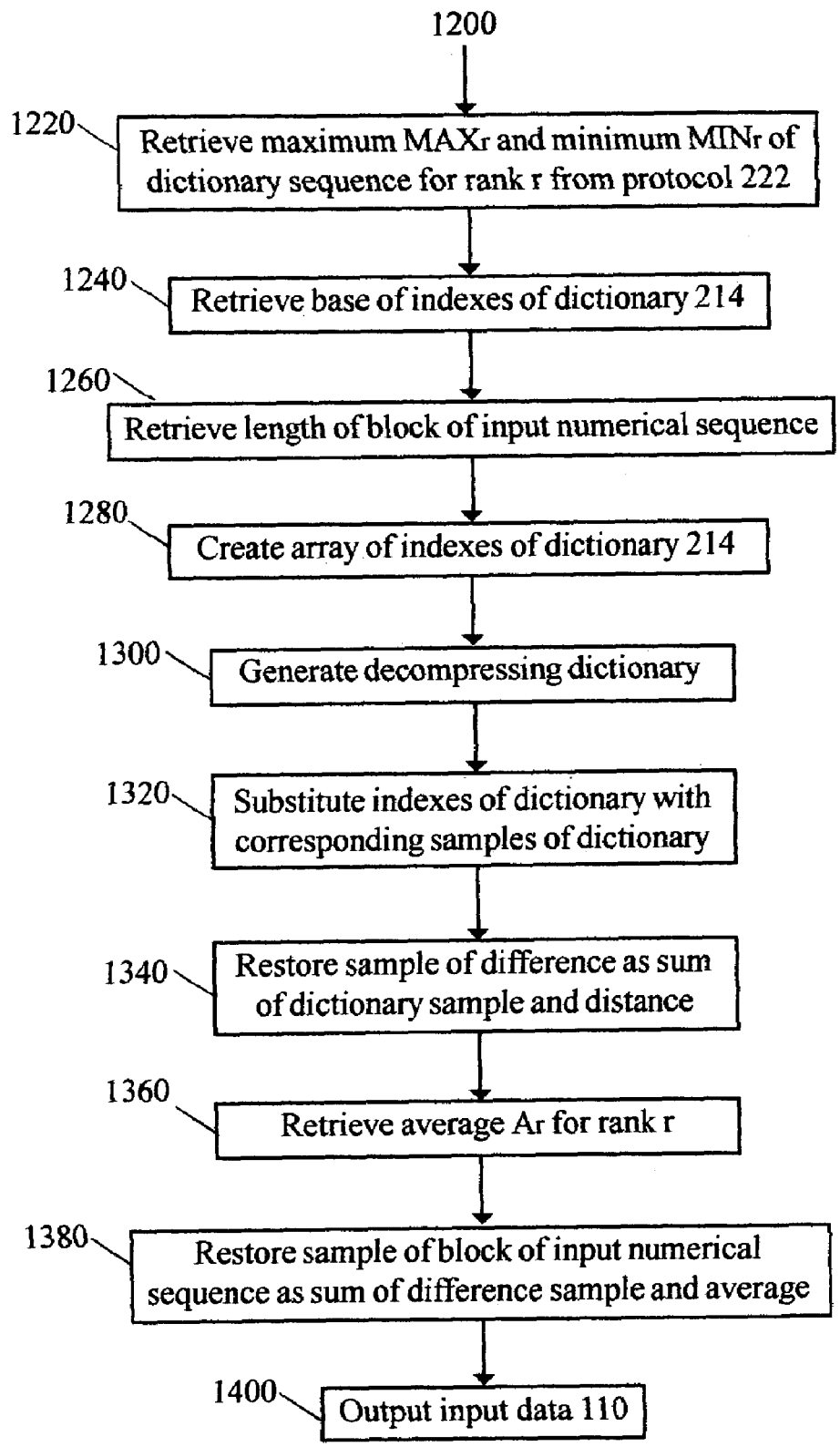
FIG. 11 depicts one embodiment of the operation of decompression with one dictionary, in accordance with the principles of the present invention.

Referring to the drawing, FIG. 11 is a block diagram of a preferred operation in detail to decompress the data compressed with one dictionary. All operations of compression, described above, were reversible, and as a result, the process of decompression is lossless. The principle of this operation is to decompress the statistically compressed sequence, to retrieve from it all components: indexes, distances, signs, parameters described a frequency distribution of the dictionary, generated by the RNG. After that a decompression dictionary is generated, that is the same as the compression dictionary, and indexes of the dictionary are substituted with the samples, to perform reversed operation of decompression. Step 980 loads in the memory mean the compressed data 232. Step 1000 performs LZ decompression of the data. This operation described in details in: Storer J. A. Data Compression: Method and Theory, Computer Science Press (1993), which is hereby incorporated herein by reference in its entirety. Operation of LZ decompression included in the same aforementioned commercially available products, implementing LZ compression.

Step 1020 performs positional decompression and restores output sequence 218. It is the shifting operation, but in the opposite direction, than was used for compression. For example, if a compressed sequence is 08 00 11 (radix 10), than decompressed sequence is 01000 00000 01011. Step 1040 retrieves from the decompressed sequence and loads in the memory mean the protocol 222, and the consequent steps retrieve from the protocol the necessary data to generate the decompression dictionary.

Step 1060 loads the output sequence 218 in the addressable memory area. Step 1080 retrieves the sequence of dictionary indexes 214 from the output sequence 218. Step 1090 retrieves the sequence of ranks of the dictionary sequence, created by step 304 FIG. 3, from the output sequence 218. Step 1100 retrieves the sequence of the distances 216 with the signs from output sequence 218. Step 1120 creates the array of distances 216 to accelerate the operation of decompression. Step 1140 creates the array of signs of the distances.

Step 1160 retrieves the seed S1 of the RNG from the protocol 222. Step 1180 retrieves the number of ranks Nrank (assigned by step 300). Step 1200 retrieves the number of samples Nr for the rank r (calculated by step 406, FIG. 4). Step 1220 retrieves the maximum MAXr and the minimum MINr for the rank r (calculated by step 404 FIG. 4). Step 1240 retrieves the base of the indexes of the dictionary. The number of the dictionaries in this operation is one, so the base could be predetermined in the operation of compression. Step 1260 retrieves the length of the BINS. Step 1280 creates an array of the indexes 214 of the dictionary. Step 1300 generates the decompressing dictionary, as described by steps 506–512, FIG. 5. The RNG will be executed for every rank the number of times equal to the number of samples Nr with the amplitude between MAXr and MINr.

Step 1320 substitutes the indexes of the dictionary from the output sequence with the samples of the dictionary, corresponding to these indexes. Step 1340 restores a sample as a sum of the distance and the corresponding dictionary sample. Step 1360 retrieves from the protocol 222 the average Ar for the rank r, which was calculated by step 308 FIG. 3, and assigns the average Ar to every sample from step 1340 according to the rank from step 1090. Step 1380 restores an original sample of the BINS as the sum of a sample from step 1340 and an average Ar from step 1360. Step 1400 outputs the input data, as the sequence of the restored input samples.

Decompression with Multiple Dictionaries

Figure 12:
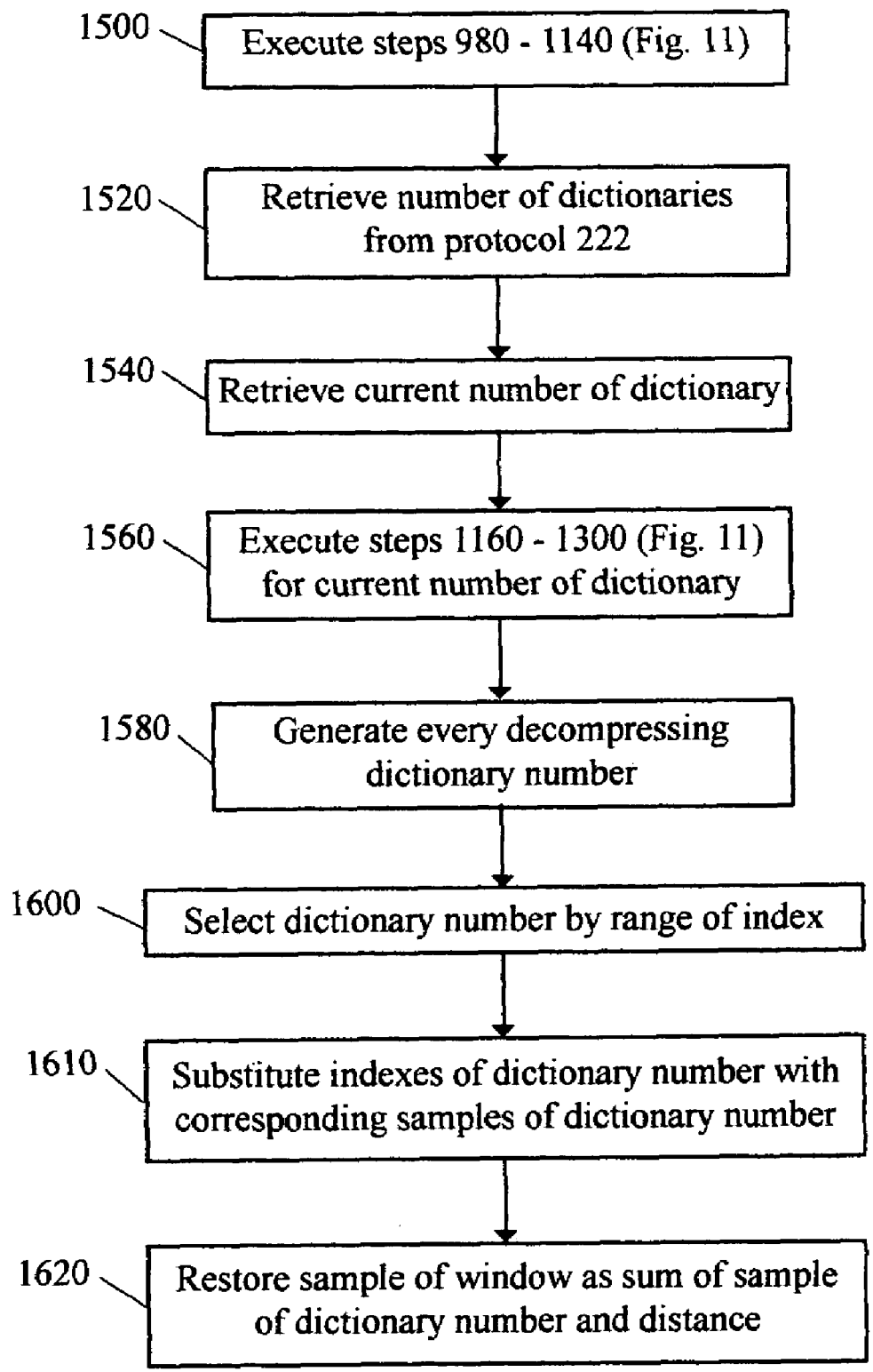
FIG. 12 depicts one embodiment of the operation of decompression using multiple dictionaries, in accordance with the principles of the present invention.

Referring to the drawing, FIG. 12 is a block diagram of a preferred operation in detail to decompress the data compressed with multiple dictionaries. This operation performed in the same way, as an operation of decompression for one dictionary, but indexes in the sequence of 218 used to identify a particular dictionary used for compression. Parameters to generate all decompression dictionaries retrieved from the protocol.

Step 1500 executes steps from 980 to 1140, FIG. 11. Step 1520 retrieves the number of the dictionaries used in the operation of compression from the protocol 222. Step 1540 retrieves the current number of the dictionary. Step 1560 generates the current decompression dictionary and executes steps 1160–1300 FIG. 11 to retrieve the base for the indexes and all parameters of the statistical description of the current dictionary (the number of samples, the maximum, and the minimum by the rank). Step 1580 generates every decompressing dictionary for the number of dictionaries from step 1520. The base for the indexes defines the range of the indexes.

Step 1600 selects the dictionary number—it scans through the array of dictionary indexes, retrieved by step 1080, and selects the dictionary by the range of the indexes of the dictionary. Step 1610 substitutes the indexes of the dictionary in the output sequence with the corresponding samples of the dictionary, like in step 320, but the samples of the dictionary are retrieved from the corresponding dictionary. Step 1620 executes the operations in steps from 1340 to 1400 to restore the sequence of the input samples. Any operation for a particular dictionary is similar to the corresponding operation in one-dictionary operation of compression-decompression.

Accelerated Search Utilizing CAM

FIG. 1c explained the basic concept, FIG. 13–FIG. 16 teach different implementations of accelerated search utilizing CAM to be utilized separately or in a combination according to an available computer means and priorities for a particular application.

Figure 13:
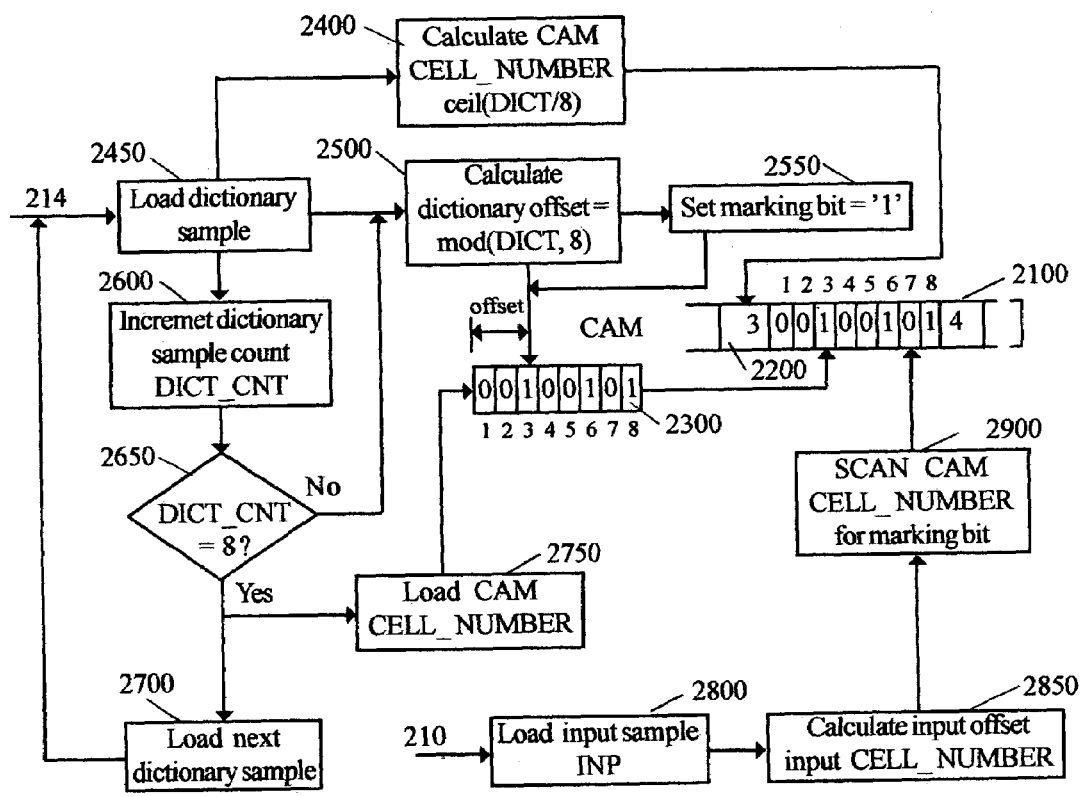
FIG. 13 is the block diagram of a preferred logic of the major operation of search, utilizing CAM accelerator with packed memory cells.

FIG. 13 explains the process of acceleration utilizing CAM 2100 with packed memory cells. In the current embodiment, a CAM memory cell does not contains a value of a sample, but only a marking bit 2300 (FIG. 1c), indicating a presence of the sample with a certain amplitude in the address equal to an amplitude. If an array of registers used as CAM, said marking bit will be set up in a corresponding offset. But a size of a physical addressable memory cell for universal modern computers could be from 8 to 64 bits. An address space is significantly reduced, if marking bits corresponding to the successful CAM cells are shifted, until the cells are completely packed. A successful dictionary sample from the dictionary 214 is loaded in step 2450, step 2400 calculates a cell address (CELL_NUMBER), and step 2500 calculates an offset (DICT_OFFSET), corresponding to the current amplitude DICT:

$DICT\_OFFSET = \mod(DICT, 8);\ cell\_number = cell(DICT/8)$

The offset 2500 set-up a marking bit to '1' in step 2550, and said bits corresponding to successful dictionary samples, are accumulating in a register 2300 that is shown with the length of one byte. In modern computers it could have a length up to 64 bits. A state machine models said register in a memory cell with a large virtual address space. The step 2600 is incremented for every successful dictionary sample, the next step 2650 checks if the number of samples is equal to the size of CAM cell. If this condition is true, step 2750 loads CAM 2100 to the address CELL_NUMBER 2200 with the contents of register 2300 and load the next group of dictionary samples in step 2450. The register 2300 will be ready to accumulate a new sequence of dictionary samples.

Input samples 210 are loaded in step 2800 after CAM buffer is filled with packed marking bits, indicating a presence of dictionary samples. The offset and the a cell number for the input sample are calculated in steps 2850,2900 with same rule as for the dictionary samples (in steps 2400, 2500), and step 2900 scans CAM 2100 for the presence of the marking bit, indicating a presence of a dictionary sample. If a marking bit is found, that means that there is a dictionary sample, equal to this input sample, and the least distance is zero. If a dictionary sample is not found in this cell, scanning mean 2900 bitwise checks adjacent bits, until a first marking bit is found. The difference between the offsets of input and dictionary samples is the least distance. Those skilled in the art know that modern programming languages include logical bitwise operations, and many microprocessors include bitwise logical operations.

Questions related to the implementations of memory packing, including hardware, described more in details in: P. A. Franaszek et al. Algorithms and Data Structures for Compressed Memory Machines, IBM J. Res. & Dev., Vol. 45, NO. 2, March 2001, p.p. 245–257; U.S. Pat. No. 5,612,693 (Craft) col.1–12; US application 2003/0117299 (Jones), that are incorporated here by reference. An intensive testing showed that a reduction of the address space for CAM with packing (FIG. 13) significantly accelerated the search, because it is executed in the area of a fast memory. The program EXTPACK.TXT on the included CD performs the whole operation with all details.

Figure 14:
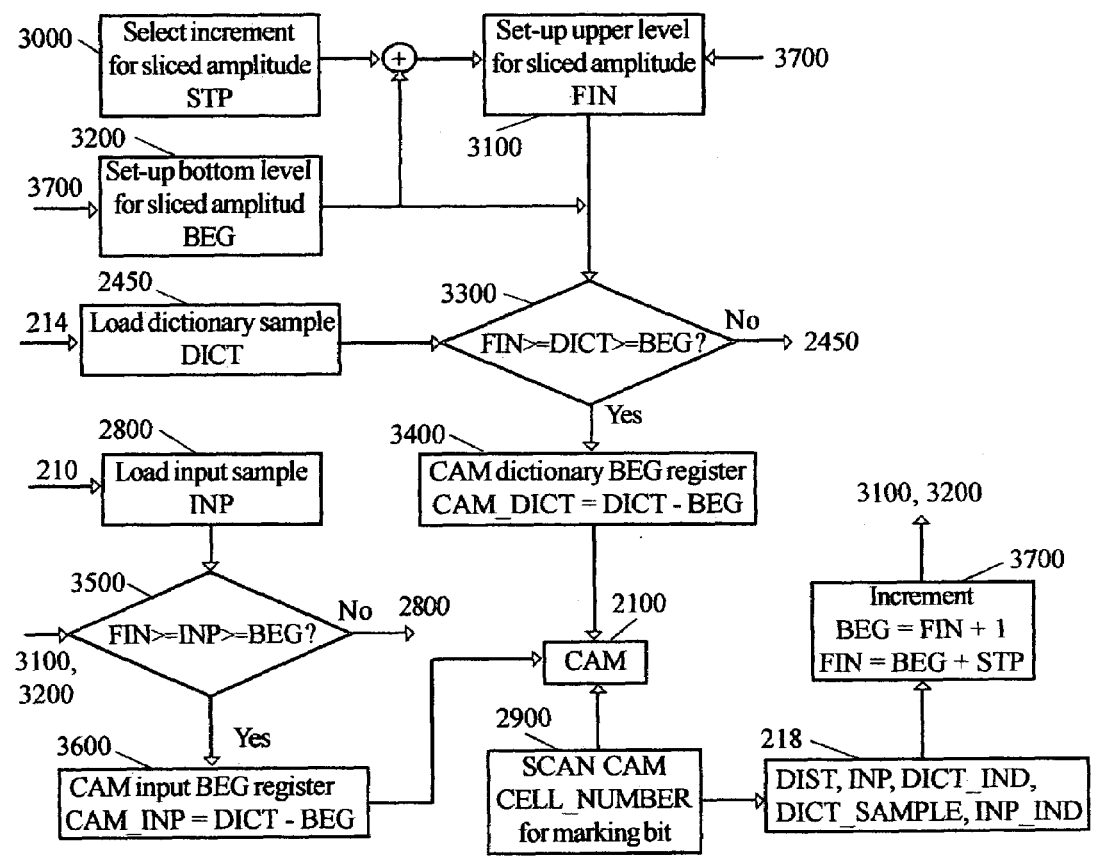
FIG. 14 is the block diagram of a preferred logic of the major operation of search utilizing CAM accelerator with slicing of the amplitudes of both dictionary and input sequences.

FIG. 14 teaches the method of acceleration in details with slicing of amplitudes both dictionary and input samples, loaded to the CAM buffer. The objectives of this operation are the next: a) to eliminate large gaps in the address space of the CAM buffer, b) to perform the search in a small and fast addressable CAM area, c) to perform an operation of compression with small portable devices.

Said objectives are illustrated with this example. The dictionary sequence to load in CAM is: 3 7 9 11 12 13 15 17 20 80 82. The address space for CAM is limited by the maximum amplitude (82) with a large unused space between 20 and 80. If this sequence is sliced for the first slice from 0 to 30 and the second slice from 31 to 100, there are two new sequences: 3 7 9 11 12 13 15 17 20 and 80 82. Every sequence will be loaded in CAM starting with zero address because of CAM BEG registers are provided, that keep the shift for beginning of said sequences. The search of the least distances is performed for every successful slice of predetermined size in the limited address space, until the whole range of amplitudes is searched. Intermediate outputs are concatenated.

Step 3000 selects an increment STP for a slice of an amplitude, that added to bottom level BEG in step 3200 to calculate the upper level FIN of said slice in step 3700. A successful samples of the input (loaded in step 3700 from the input sequence 210) and a dictionary (loaded in step 2450 from the dictionary sequence 214), compared by the corresponding steps 3300 and 3500 with limits FIN and BEG for the amplitudes of said sequences. The dictionary samples that satisfied to these conditions shifted in step 3400 with a dictionary register that shifts the sequence of selected samples to start it in CAM from the zero address; this sequence loaded to CAM 2100.

The input samples that satisfied to these conditions copied to CAM input register that shifts the sequence of selected samples in the step 3600 to start it in CAM from the zero address. The step 2900 scans this sequence in CAM 2100 for the marking bits of dictionary with matching logic. Matching logic is bitwise logic 'AND' as was explained in FIG. 1c. The sequence with least distances 218 is outputted and step 3700 increments the limits for the next slice: BEG=FIN+1; FIN=BEG+STP to continue the search cycle until all samples will be matched.

The search cycle described above described with all details in the program EXTSLICE.TXT on the attached CD. The search cycle used as a subroutine, with the size of the search buffer defined automatically outside of this subroutine according to the number of samples, satisfied to the selection conditions BEG and FIN. As a result, only necessary memory space is used. The effect of acceleration was observed in Windows XP environment, starting with a number of slices from two to four. If number of slices was increased up to forty, that demonstrated that a small address space for a CAM buffer is useful because small and cheap portable devices could be used to work with a large files of compressed data.

Figure 15:
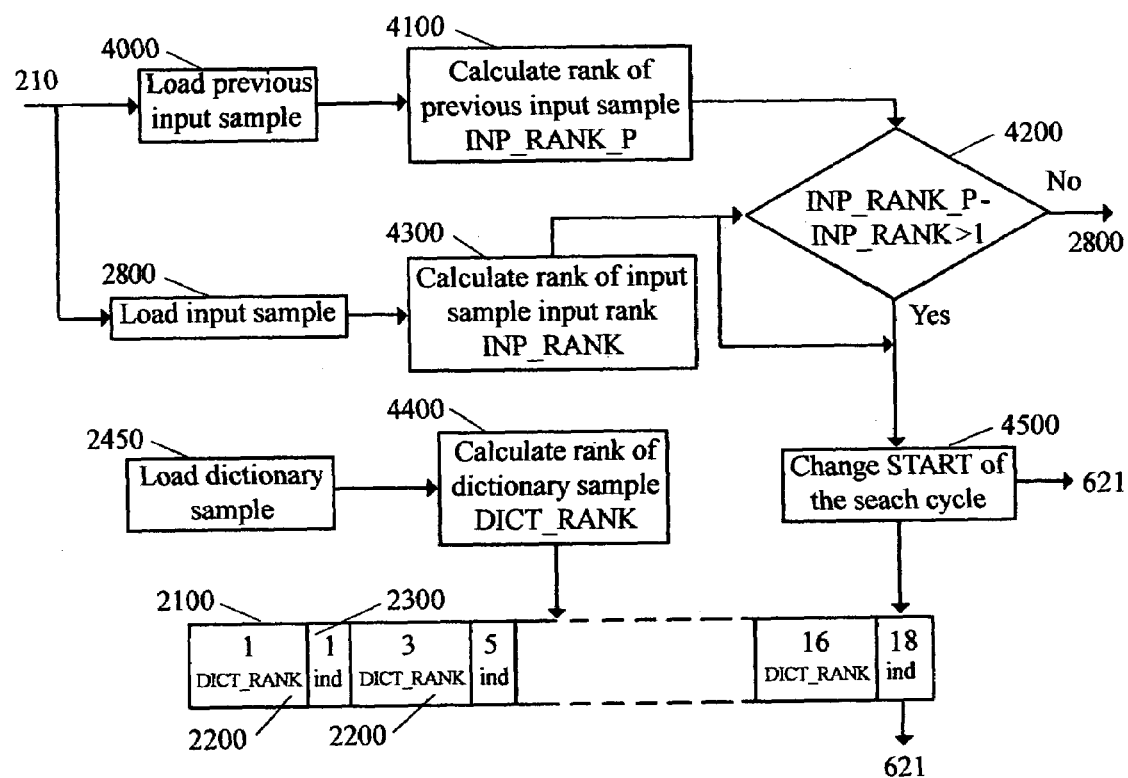
FIG. 15 is the block diagram of a preferred logic of the major operation of search utilizing CAM accelerator with ranking of dictionary and input samples.

In another embodiment FIG. 15 teaches to how to accelerate the search utilizing CAM with ranking of dictionary and input samples. The objective of this operation is to eliminate unnecessary steps in a search cycle, if an input sequence is represented by large changes of amplitude that is usual for some images like medical ones (a dark spot with a grey background). This teaching is illustrated with the next example: The dictionary sequence is: 3 7 9 11 12 13 15 17 20 80 82. The input sequence (BIN) is: 5 7 8 9 80 82 85. The ranks calculated for this input: 1 1 2 2 16 16 17. The search cycle for the input sample 9 will be stopped with the best dictionary sample 9. The next input sample is 80 with the rank 16. The logical condition for ranks of samples 80 and 9 (80−9)>1 is true. The search cycle should not try dictionary samples between 9 and 80. CAM address for the rank 16 gives the dictionary index 10. The START of the search cycle upgraded from 9 to 80. The small area of CAM for dictionary indexes (for only samples in the beginning of the group with same rank) accelerated the search.

Step 2800 loads a successful input sample from an input sequence 210 step 4000 keeps the previous input sample. Steps 4100 and 4300 calculate ranks for corresponding current and previous input samples. Step 4200 checks the condition if the difference between these ranks is changed abruptly. If this condition is not true, the search cycle continued without changes. If the abrupt change of the rank is detected, step 4500 changes variable START in step 621. Said change is defined with CAM 2100. In the example of the current implementation CAM address is equal to a rank of the dictionary (DICT_RANK). The content of said memory cell is value of the index of the dictionary corresponding to the beginning of the group of dictionary samples with said rank. Variable START 621 upgraded to said index of the dictionary.

In another embodiment the current invention further accelerates the search with an operation of merging. The objective of this operation is to limit said search only to unique input and dictionary samples. If a large image is processed, like six Megapixels, with one byte for pixel (grey-scale), an alphabet for this sequence is only 256 unique samples (bytes) or less, so these samples may be selected to find the best match with dictionary samples. After that the result of said search is merged by input amplitude with the original input sequence to provide all original samples with the least distances and selected dictionary samples. The testing showed that an operation of merging 'many to one' with sorting is many times faster than operation of search. The program EXTSEARCH.TXT on CD performed this operation, described with all details. Here is the major operation described in SAS Language:

*keep dictionary samples with unique amplitudes in output dataset;

proc sort data=DICT nodupkey out=DICT_UNIQUE;

by AMP;

run;

*keep input samples with unique amplitudes in output dataset;

proc sort data=INP nodupkey out=INP_UNIQUE;

by AMP;

run;

proc sort data=FIN nodupkey out=DICT_UNIQUE; * sort search results;
  by AMP; /* find the least distances between input and dictionary samples in FIN dataset */
  run;
proc sort data=INP; * sort input data set;
  by AMP;
  run;

data INP; /* merge original input data set with dataset with the unique samples */
  merge INP (in=ina) FIN; * many to one merging;
    by AMP;
    if in a;
    run;
proc sort data=INP; * restore original data set with least distances included;
  by IND_INP;
  run;

In another embodiment, the sequence of least distances substituted with two new sequences: the first one is modified old sequence and the second—the supplemental sequence. The first sequence created by means of removing of samples greater than a predetermined level. The second sequence comprised of plurality of said removed samples and their indexes, identified positions of these samples in the original sequence of least distances. For example, with the level of selection 3, a sequences of least distances 1,0,3,0,24,1,123, 0,1,0 is substituted with two sequences: 1,0,3,0,1,0,1,0 and 24,5,123,7. The purpose of these substitutions is to improve the efficiency of operations of positional, statistical and decorrelation types of compression, because they are sensitive to outliers, and these operations of compression are applied to these new sequences separately. This example shows, that the length of the second sequence could be only a few percents of the length of the first sequence, but a number of bits for the coding of the samples of the first sequence is substantially reduced. This operation to split the sequence of least distances may be repeated with several levels to select samples. Said original sequence of least distances is restored in inverse order, starting with the first pair 'sample-index: 1,0,3,0—24—1—123,0,1,0. This operation of compression is accelerated with bitwise shifting, compared with the prime art.

Though the invention has been described and illustrated with respect to a limited number of embodiments, it will be appreciated that many variations, modifications and other applications of the invention may be maid.

What is claimed is:

1. A method of binary data compression of a sequence of data values for transmission or storage, using a dictionary sequence, comprising:
  a) generating an input numerical sequence comprising of numerical samples, associated with the input binary sequence wherein said numerical samples have predetermined peak amplitude;
  b) generating dictionary sequences of numerical samples utilizing random number generators with predetermined both a peak amplitude and a length;
    wherein said random number generators having a peak amplitude an about similar as said peak amplitude of samples of said input numerical sequence;
    wherein said random number generators having a sufficient length to cover approximately multiple amplitudes of said input numerical sequence;
  c) generating a sequence of indexes having a value of positions of said numerical samples of said dictionary sequences in said dictionary sequences by utilizing an addressable memory area;
  d) accelerating of matching both said sequences of said dictionary and said input samples utilizing a buffer of content addressable memory;
    wherein an address of a successful cell of said buffer of said content addressable memory associated with an amplitude of said numerical sample of said dictionary sequence;
  e) testing said successful said input numerical samples against said content addressable memory for the first found said dictionary sample;
    wherein an address in said content addressable memory of said input numerical sample associated with said amplitude of said input numerical samples;
  f) selecting a best dictionary sample having a shortest distance between said numerical sample of said dictionary sequences and said input numerical sample for said input numerical sequence;
    wherein said selection of said best dictionary sample utilized said acceleration; wherein said best shortest distance is an offset between said address of current input numerical sample and said first found dictionary sample associated with said content addressable memory;
  g) generating a sequence of said indexes of said best dictionary samples;
  h) generating a protocol with a sequence of both predetermined and calculated parameters of said input numerical and dictionary sequences, comprising: said lengths of both said input numerical and dictionary sequences, said peak amplitude of said input numerical sequence, the seeds of said random number generators;
  i) generating output sequence comprising: said shortest distances, said indexes of corresponding dictionary samples, having said shortest distances, and said protocol;
    whereby providing reversible transforming of the input random binary data with a small number of repetitions to said output sequence comprising a sequence having small amplitude and many repetitions;
  j) performing compression for said output sequence;
  k) selecting a method of said compression from a list comprising: Lempel-Ziv type dictionary compression, statistical coding, decorrelation, memory cells packing, according to one or more criteria, selected based on a particular application;
    whereby providing lossless compression of a random said input binary sequence with a calculated random said dictionary sequence, approximately matching said input numerical sequence.

2. The method of claim 1, wherein said at least one specified criterion comprises one or more of the following criteria:
  a) maximizing a compression ratio of said lossless compressed said input data;
  b) minimizing duration of an operation of said lostless compression of said input data;
  c) minimizing a time of an operation of transmission of said lostless compressed said input data;
  d) maximizing a level of protection of said input binary sequence from unauthorized reading;

e) accelerating a speed of a compression;
   whereby providing adaptation of the process of compression and decompression to a particular application.

3. The method of claims 1 further comprising:
   a) determining a frequency distribution for said input numerical sequence;
   b) generating of said dictionary sequence, utilizing a scaling transformation, having said frequency distribution similar for both said dictionary and said input numerical sequences;
   c) accumulating parameters of said frequency distribution for said dictionary in said protocol;
      whereby providing improvement of a coverage of a range of changes of said amplitude of said input numerical sequence by said numerical dictionary sequence;
      whereby providing a reproduction of said dictionary sequences for a decompression operation.

4. The method of claim 1 wherein said step of determining said frequency distribution comprising:
   a) determining a maximum and a minimum of said numerical input sequence;
   b) generating said dictionary sequence utilizing a scaling transformation having said maximum and said minimum of said dictionary sequence similar to said maximum and said minimum of said numerical input sequence;
   c) accumulating said maximum and said minimum in said protocol;
      whereby providing improvement of a coverage of a range of changes of said numerical sequence by said numerical dictionary sequence.

5. The method of claim 1 further comprising:
   a) selecting a predetermined number of levels of a ranking code value;
   b) assigning said ranking code value associated with the amplitude of said sample of said numerical input sequence;
   c) calculating an average value for said samples of said numerical input sequence having the same said ranking code;
   d) calculating a sequence of centered differences between said current samples of input numerical sequence and said average having the same ranking code;
      whereby providing reversible transformation of said input numerical s sequence to a sequence with small amplitude and an increased number of repetitions;
   e) selecting said sequence of the centered differences as an output to the operation described by step a) of claim 1;
   f) accumulating in said protocol said number of levels of ranking code value, said average value and said corresponding ranking code;
   g) performing operations described in steps b)–i) of claim 1;
      whereby improving the process of an approximation of the random input numerical sequence with sad small amplitude with the random dictionary sequence of the predetermined length.

6. The method of claim 5 further comprising:
   accumulating the centered differences in a number of successive cycles, with input of a current cycle being substituted with an output from a previous cycle, wherein said averages and said cycle number being accumulated in said protocol;
      whereby providing a reversible transformation of said input numerical sequence to a sequence with small said peak amplitude and an increased number of repetitions of said samples of said numerical input sequence;
      whereby providing improved approximation of said input numerical sequence with said dictionary sequence.

7. Method of claim 4 wherein said operation of calculating of said frequency distribution comprising steps of:
   a) calculating said frequency distribution for said input numerical sequence for a group of said amplitudes with the same rank code variable;
   b) generating said dictionary sequence utilizing said scaling transformation having said frequency distribution similar to said frequency distribution of said input numerical variable for every rank code variable;
      whereby providing improved approximation of said input numerical sequence by said dictionary sequence in sub ranges of changes of said amplitude of said input numerical sequence.

8. Method of claim 1 wherein said frequency distribution calculated comprising steps of:
   a) determining said maximum and minimum, said number of said samples for said input numerical sequence for a group of said amplitudes with the same rank code variable;
   b) determining a percentage of said number of samples of said input numerical sequence for said group with said ranking code from a total number of samples from said number of samples of said input numerical sequence;
   c) determining a number of samples of said dictionary sequence for every group of said samples with the same ranking code through computing said number as a result of multiplying said percentage of said number of samples of said input numerical sequence by said length of said dictionary sequence;
   d) generating said dictionary sequence utilizing a cycle, wherein a number of iterations in said cycle is about the same as said number of samples of said dictionary sequence for every group of said samples with the same ranking code;
   e) generating said dictionary sequence in said cycle utilizing said scaling transformation wherein said maximum and said minimum similar to said maximum and said minimum of said input numerical variable for every rank code variable;
   f) accumulating in said protocol said maximum, said minimum, and said number of samples for every group of said samples with the same ranking code for said dictionary sequence;
      whereby providing improved approximation of said input numerical sequence by said dictionary sequence in sub ranges of changes of said amplitude of said input numerical sequence.

9. The method of claim 1 further comprising:
   a) assigning predetermined upper and lower levels for selection of said least distances;
   b) retrieving a sequence of samples from said input numerical sequence corresponding to said least distances are in a range of said upper and bottom levels;
   c) generating a sequence of indexes having a value of positions of said selected samples in said input numerical sequence;
   d) substituting output of operation step a) of claim 1 with said sequence of said selected samples claim 1, step b);
   e) assigning a unique base value and a range for said index of said consequent dictionary sequence;
   f) repeating steps from b) through g) of claim 1;

g) assigning a dictionary number to of said consequent dictionary sequence;
h) accumulating a table of correspondence between said dictionary number said base value and said range for said index of said dictionary sequence in said protocol;
i) comparing said least distances produced by said consequent dictionaries for corresponding samples of said input numerical sequence;
j) selecting a smallest distance from a plurality of said least distances for corresponding samples of said input numerical sequence;
   whereby providing a lossless consequent refinement of the results of an approximation of said input numerical sequence by said multiple random dictionaries.

10. The method of claim 1, further comprising:
a) repeating operations steps from a) through j) with a predetermined number of said repetitions;
   whereby providing a lossless consequent refinement of the results of an approximation of said input numerical sequence by said multiple random dictionaries.

11. The method of claim 1, further comprising:
a) substituting said input numerical sequence with said sequence of said least distances and said indexes of the dictionary sequence;
b) repeating said operations steps from a) through i) with a predetermined number of said repetitions;
   whereby providing the further process of the consequent refinement of the data compression by a number of iterations.

12. The method of claim 1, step d) further comprising:
a) sorting both said input numerical sequence and said dictionary sequences;
b) accumulating sequences of both pre-sorted indexes of said input numerical sequence and said dictionary sequences;
c) selecting a predetermined number of levels of a ranking code value;
d) assigning said ranking code value associated with the amplitude of said sample of said numerical input sequence;
e) performing a search cycle of finding said least distance between a sample of said sorted input numerical sequence and said samples of said sorted dictionary sequence;
f) starting a search cycle of finding said least distance for the first sample of said sorted input numerical sequence with the first sample of said dictionary sequence;
g) finding current absolute distance between said sample of said sorted input numerical sequence and a current dictionary sample of said dictionary sequence in said search cycle;
h) finding a previous absolute distance between said sample of said sorted input numerical sequence and a previous dictionary sample of said dictionary sequence in said search cycle;
i) comparing said current and said previous distance;
j) assigning to a stopping variable value equal to one when said current distance is not smaller than said previous distance;
k) assigning said best dictionary sample to a sample of dictionary sequence when said stopping variable is equal to one;
l) determining an index of said best dictionary sample from said sequence of pre-sorted indexes of said dictionary sequence for a corresponding said dictionary sample;
m) finishing said search cycle when said stopping variable is equal to one;
n) accumulating said best dictionary sample, corresponding to said smallest distance and said index of said best dictionary sample;
o) assigning to a stopping variable value equal to null when said search cycle started for the next said sample of input numerical sequence;
p) starting a search cycle of finding said least distance for the next said sample of said sorted input numerical sequence from said best dictionary sample of said dictionary sequence from the previous said search cycle;
r) accelerating said search cycle utilizing a selection of said beginning of said search cycle, having one input said ranking code of a last said dictionary numerical sample in a group, having the same said ranking code;
s) having a calculated said ranking code of said input numerical sample as the second input to said selector of said beginning of said search cycle;
t) assigning by an output of said selector of said beginning of said search cycle to a dictionary numerical sample, having said rank higher then said rank of the successful input numerical sample;
u) repeating said steps until an end of said sorted input numerical sequence;
v) restoring pre-sorted input numerical sequence from said sequence of pre-sorted indexes of said input numerical sequence;
   whereby limiting said search cycle to a group of said dictionary numerical samples having said amplitude large enough to produce said least distance.

13. The method of claim 1, wherein step f) further comprising:
a) shifting said successful marking bits in a shifting memory cell, filling a size of an addressable cell of said content addressable memory;
b) copying said shifting memory cell to said addressable cell of said content addressable memory until said addressable memory cells are packed with said marking bits for all successful said input numerical sample;
c) testing said successful cells of said content addressable memory for a first said marking bit, starting with an offset in a cell of said content addressable memory corresponding to an amplitude of successful said input numerical sample;
c) calculating said least distance between said numerical input and dictionary samples as an offset between said marking bit corresponding to said dictionary numerical sample;
   whereby providing further acceleration of said matching with reduction of used memory space for a said content addressable memory;
   whereby utilizing fast cash memory and registers for said acceleration.

14. Method of claim 1 further comprising:
a) utilizing said content addressable memory for both said sequences of input and dictionary numerical samples;
b) assigning a shifting memory cell to a starting position of a first input numerical sample of said input numerical sequence;
c) assigning a shifting memory cell to a starting position of a first dictionary numerical sample of said dictionary numerical sequence;

d) performing search of the first marking bit corresponding to said successful dictionary numerical sample for every successful marking bit corresponding to said input numerical sample;

e) calculating said least distance for every successful marking bit of said input numerical sequence as said offset between said marking bit corresponding to said input numerical sample and said first corresponding marking bit of said dictionary numerical sample;

whereby providing further acceleration of said search of said matching with simultaneous bitwise logical comparisons in said content addressable memory.

15. Method of claim 1 further comprising:

a) loading said content addressable memory with selected both said dictionary numerical samples and said input numerical samples having said amplitude in a successful predetermined range;

b) selecting a best dictionary sample having a shortest distance between said selected both said dictionary sequences and said input numerical samples;

whereby providing further acceleration of said matching with reduction of used memory space for a content addressable memory;

whereby further utilizing a small addressing space for a fast cash memory and registers for said acceleration;

c) concatenating outputs of said accelerating matching for said successful predetermined ranges.

16. Method of claim 1 further comprising:

a) coping said input numerical sequence to a sequence with unique said numerical samples;

b) performing said accelerating approximate matching between said sequence with said unique numerical samples and said dictionary numerical sequence;

c) merging said sequence with unique said numerical samples and founded said least distances with said original input numerical sequence;

whereby providing further acceleration of said matching with a reduction of used memory space for a content addressable memory.

17. Method of claim 1 further comprising:

a) utilizing an array of registers for said content addressable memory;

b) shifting a successful position of said marking bit in a corresponding register until all successful said registers in said array of registers are packed;

c) testing said successful registers of said array of registers for a first said marking bit, starting with an offset in a register of said array of registers corresponding to an amplitude of successful said input numerical sample;

whereby providing further acceleration of said matching with a reduction of used memory space for a high speed content addressable memory and high speed bitwise comparisons.

18. The method of claim 1, further comprising:

a) selecting from said least distances samples larger than a predetermined level;

b) creating the second new sequence of least distances comprising of said selected samples of said least distances and indexes of said selected samples;

c) applying any said type of positional, statistical or decorrelation compression separately to both said first and second created sequences of said least distances; whereby providing the further process of improvement of efficiency of the data compression.

19. An apparatus for binary data compression of a sequence of data values for transmission or storage, using a dictionary sequence comprising:

a) computer readable program code means for causing a computer to create a sequence of numerical equivalents of said input data with a predetermined peak amplitude and a predetermined number of said numerical equivalents;

b) computer readable program code means for causing a computer to calculate a frequency distribution of said sequence of numerical equivalents of said input data;

c) computer readable program code means for causing a computer to generate a dictionary sequence utilizing a random number generator having said frequency distribution similar for said dictionary sequence and said sequence of numerical equivalents of said input data;

d) computer readable program code means for causing computer to perform accelerated approximate matching between every said numerical equivalent of said input data and said sequence of dictionary samples, utilizing a content addressable memory;

e) computer readable program code means for shifting a successful position of said marking bit in a corresponding memory cell until all successful said memory cells in said array of cells are packed;

f) computer readable program code means for testing said successful cells of said array of memory cells for a first said marking bit, starting with an offset in a memory cell of said array of cells corresponding to an amplitude of successful said input numerical sample;

g) computer readable program code means for causing a computer to search for a least distance from a plurality of distances between every said numerical equivalent of said input data and said sequence of dictionary samples;

h) computer readable program code means for causing a computer to search for an index of a best dictionary sample, corresponding to every said least distance;

i) computer readable program code means for causing a computer outputting said sequence of least distances, sequence of said indexes of said best dictionary samples;

whereby providing transforming the random binary data to the sequence, comprising the sequence of the small samples with many repetitions;

j) computer readable program code means for causing a computer outputting a protocol with a sequence of predetermined parameters and a sequence of results of calculations, comprising the length of said sequence of numerical equivalents of said input data, said peak amplitude, a parameters of said frequency distribution for the dictionary;

whereby providing lossless decompression of said input data;

k) computer readable program code means for causing a computer performing compression for said substituted sequence and said protocol, selecting a method of said compression from a list, including: Lempel-Ziv type dictionary compression, statistical coding, decorrelation, memory cells packing, according to one or more criteria selected based on said particular application, for said substituted sequence and said protocol;

whereby providing lossless compression of the random input binary sequence with said calculated random dictionary, approximately matched said input sequence.

20. An apparatus for data compression comprising:
a) means for causing a computer to create a sequence of numerical equivalents of input data with a predetermined peak amplitude and a predetermined number of said numerical equivalents;
b) means for causing a computer to calculate a frequency distribution of said sequence of numerical equivalents of said input data;
c) means for causing a computer to generate a dictionary sequence utilizing a random number generator having said frequency distribution similar for said dictionary sequence and said sequence of numerical equivalents of said input data;
d) means for causing computer to perform accelerated matching between every said numerical equivalent of said input data and said sequence of dictionary samples, utilizing a content addressable memory, comprising:
   means to receive sequences of dictionary samples and a input samples in an array of cells of a memory;
   means to mark a position in said cell of memory having an address associated with an amplitude of successful said dictionary sample with a marking bit;
   means to shift a successful position of said marking bit in a corresponding memory cell until successful said memory cells in said array of cells are packed;
   means to test said successful memory cells of said array of memory cells for a first said marking bit, starting with an offset in a said memory cell corresponding to an amplitude of successful said input numerical sample;
   means to assign a least distance between corresponding said input and dictionary numerical samples to a difference between said offset and said marking bit in a said memory cell;
e) means for causing a computer to search for an index of a best dictionary sample, corresponding to every said least distance;
f) means for causing a computer outputting said sequences of least distances and said indexes of said best dictionary samples;
   whereby providing transforming the random binary data to the sequence, comprising the sequence of the small samples with many repetitions;
g) means for causing a computer outputting a protocol with a sequence of predetermined parameters and a sequence of results of calculations, comprising the length of said sequence of numerical equivalents of said input data, said peak amplitude, a parameters of said frequency distribution for the dictionary;
   whereby providing lossless decompression of said input data;
h) means for causing a computer performing compression for said substituted sequence and said protocol, selecting a method of said compression from a list, including: Lempel-Ziv type dictionary compression, statistical coding, decorrelation, memory cells packing, according to one or more criteria selected based on said particular application, for said substituted sequence and said protocol;
   whereby providing lossless compression of the random input binary sequence with said calculated random dictionary, approximately matched said input sequence.

* * * * *